(12) United States Patent
Ikegami et al.

(10) Patent No.: US 8,148,047 B2
(45) Date of Patent: Apr. 3, 2012

(54) CARBOXYL RESIN, HARDENING COMPOSITION CONTAINING CARBOXYL RESIN, AND HARDENED MATERIAL THEREOF

(75) Inventors: Koichi Ikegami, Nantan (JP); Noboru Kohiyama, Ome (JP); Teppei Nishikawa, Uji (JP); Michiya Higuchi, Nantan (JP); Nobuhito Hamada, Kyotanabe (JP); Hiroko Daido, Uji (JP); Chieko Inui, Uji (JP); Tatsuya Kubo, Kyoto (JP)

(73) Assignee: Goo Chemical Company, Ltd., Kyoto (JP)

( * ) Notice: Subject to any disclaimer, the term of this patent is extended or adjusted under 35 U.S.C. 154(b) by 0 days.

(21) Appl. No.: 12/996,852

(22) PCT Filed: Feb. 20, 2009

(86) PCT No.: PCT/JP2009/000748
§ 371 (c)(1),
(2), (4) Date: Dec. 8, 2010

(87) PCT Pub. No.: WO2009/150769
PCT Pub. Date: Dec. 17, 2009

(65) Prior Publication Data
US 2011/0082229 A1  Apr. 7, 2011

(30) Foreign Application Priority Data

Jun. 9, 2008 (JP) .................................. 2008-150506
Jul. 4, 2008 (JP) .................................. 2008-175307
Jul. 25, 2008 (JP) .................................. 2008-191773

(51) Int. Cl.
G03F 7/028 (2006.01)
G03F 7/032 (2006.01)
C08F 8/14 (2006.01)
C08F 290/06 (2006.01)
C08G 59/00 (2006.01)

(52) U.S. Cl. .................. 430/281.1; 430/286.1; 522/142; 522/144; 528/176; 528/192; 528/205

(58) Field of Classification Search ............... 430/280.1, 430/286.1, 281.1; 522/134, 135, 141, 144, 522/142; 528/176, 192, 205
See application file for complete search history.

(56) References Cited

U.S. PATENT DOCUMENTS 6,773,855 B1 * 8/2004 Iijima et al. ..................... 430/18
6,824,858 B2 * 11/2004 Iwaida et al. ................. 428/209

FOREIGN PATENT DOCUMENTS

| DE | 39 25 895 A1 | 2/1990 |
|---|---|---|
| EP | 0 273 729 A2 | 7/1988 |
| JP | A-52-042599 | 4/1977 |
| JP | A-61-243869 | 10/1986 |
| JP | A-05-032746 | 2/1993 |
| JP | A-09-005997 | 1/1997 |
| JP | A-11-065117 | 3/1999 |
| JP | A-2001-270930 | 10/2001 |
| JP | A-2001-316449 | 11/2001 |
| JP | A-2002-014467 | 1/2002 |
| JP | A-2004-067815 | 3/2004 |
| JP | A-2004-075931 | 3/2004 |
| JP | A-2005-091783 | 4/2005 |
| JP | A-2007-176987 | 7/2007 |
| JP | A-2009-269954 | 11/2009 |
| JP | A-2009-280726 | 12/2009 |
| WO | WO 97/16470 | 5/1997 |
| WO | WO 02/24774 A1 | 3/2002 |

OTHER PUBLICATIONS

Jan. 11, 2011 International Preliminary Report on Patentability issued in Application No. PCT/JP2009/000748 (translation).
Jan. 11, 2011 Written Opinion issued in Application No. PCT/JP2009/000748 (translation).
May 4, 2011 Supplementary European Search Report issued in European Patent Application No. 09762201.3.
Feb. 22, 2011 Office Action issued in Japanese Patent Application No. 2010-516726 (w/English-language Translation).

* cited by examiner

*Primary Examiner* — Susan W Berman
(74) *Attorney, Agent, or Firm* — Oliff & Berridge, PLC

(57) ABSTRACT

A carboxyl resin according to the present invention is obtained by a process including following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight. The carboxyl resin thus obtained has an acid value within a range from 20 to 200 mgKOH/g and is soluble in an organic solvent.

22 Claims, 7 Drawing Sheets

CARBOXYL RESIN, HARDENING COMPOSITION CONTAINING CARBOXYL RESIN, AND HARDENED MATERIAL THEREOF

TECHNICAL FIELD

The present invention relates to a hardening resin used for forming a solder resist of a printed-wiring board or the like. More specifically, it relates to a carboxyl resin, a hardening composition containing a carboxyl resin, and a hardened material of the same composition.

BACKGROUND ART

In the light of environmental problems, the recent mainstream of hardening compositions used for forming a solder resist of a printed-wiring board is a composition using a photo-setting or thermosetting resin that can be developed with a diluted aqueous alkaline solution. A generally used resin that can be developed with a diluted aqueous alkaline solution is a hardening resin obtained by adding an acid anhydride to a reaction product of an epoxy resin and a monocarboxylic acid containing an unsaturated group.

For example, Patent Document 1 discloses a hardening resin obtained by adding an acid anhydride to a reaction product of a novolac-type epoxy resin and a monocarboxylic acid containing an unsaturated group. Patent Document 2 discloses a hardening resin obtained by a process including: the reaction of an aromatic epoxy resin having two glycidyl groups in one molecule with an aromatic alcohol resin having two phenolic hydroxyl groups to obtain a secondary alcoholic hydroxyl group; the reaction of this hydroxyl group with epihalohydrin; and the addition of a monocarboxylic acid containing an unsaturated group to the reaction product of the previous step, followed by the addition of an acid anhydride.

As just described, several kinds of hardening resins have been proposed to date, which are nowadays widely used for actual production of printed-wiring boards.

The density of the printed-wiring boards has been increased with the recent decrease in the size and weight of electronic devices, and this increase in the density of the printed-wiring boards has increased the demand for a solder resist with higher performances. However, the conventionally available commercial hardening compositions do not have adequate development properties for the production of high-density printed-wiring boards; the image resolution achieved by those compositions is insufficient for the required high density. Furthermore, a high-density printed-wiring board produced by using a solder resist made of a conventional hardening composition has the problems of the decrease in the flexibility as well as the decrease in the electrical insulation property and the bleaching under high temperature and humidity.

As a hardening composition for solving the flexibility problem, a photosensitive carboxyl prepolymer has been proposed (refer to Patent Document 3), which is obtained as follows: An alcoholic secondary hydroxyl group on a bisphenol A-type epoxy resin is made to react with epihalohydrin to obtain a polyfunctional epoxy resin. Subsequently, this epoxy resin is made to react with 0.2-1.2 mol of an ethylenically unsaturated carboxylic acid per epoxy equivalent weight, and further with 0.2-1.0 mel of one or both of a polybasic carboxylic acid and its anhydride per epoxy equivalent weight.

Patent Document 4 discloses a photosensitive prepolymer having a carboxyl group. This prepolymer is obtained as follows: A mixture of a novolac-type epoxy resin and a rubber-modified bisphenol A-type epoxy resin is made to react with 0.2-1.2 mol of an ethylenically unsaturated carboxylic acid per epoxy equivalent weight of the aforementioned mixture, and the product of this reaction is further made to react with 0.2-1.0 mol of a polybasic carboxylic acid and/or its anhydride per epoxy equivalent weight of the aforementioned mixture.

Patent Document 5 discloses a hardening composition using a vinyl ester resin, where the vinyl ester resin is obtained as follows: An epoxy resin having two or more glycidyl groups in one molecule is made to react with an ethylenically unsaturated monocarboxy lie acid and a polybasic acid at a predetermined ratio, after which a portion of the primary and/or secondary hydroxyl groups in the product of the previous reaction is subjected to an esterification reaction with a chloride of an ethylenically unsaturated monocarboxylic acid, and then a portion or all of the hydroxyl groups remaining in the obtained reaction product is subjected to an esterification reaction with a polybasic acid and/or a anhydride of a polybasic acid.

A resist film obtained by using the aforementioned hardening composition is excellent in flexibility. However, when the reaction ratio of the ethylenically unsaturated carboxylic acid is within a certain range, a gel or high polymer is formed during the reaction, so that no sufficient development property can be obtained. For example, when 0.2-0.7 mol of an ethylenically unsaturated carboxylic acid per epoxy equivalent weight is made to react with the aforementioned epoxy resin, and the resultant epoxy resin containing an ethylenically unsaturated carboxylic group is made to react with 0.2-1.0 mol of a polybasic carboxylic acid and/or its anhydride per epoxy equivalent weight, then the polybasic carboxylic acid and/or its anhydride acts as a crosslinking agent for the aforementioned epoxy resin containing an ethylenically unsaturated carboxylic group, causing the resin to turn into a gel or high polymer and thereby lowering its development property. Thus, the aforementioned hardening composition does not help in producing high-density printed-wiring boards required for supporting the recent decrease in the size and weight of electronic devices.

On the other hand, a method for improving the tack-free property of a hardening resin by utilizing the formation of the high polymer has been proposed (refer to Patent Document 5). The tack-free property is one of important properties of a photoimageable liquid resist. However, it is incompatible with the alkali development property. Given this problem, a technique disclosed in Patent Document 5 is aimed at achieving a trade-off between the tack-free property and development property of a hardening resin by the addition reaction of a polybasic acid and/or an anhydride of a polybasic acid to a hydroxyl group. However, even this technique cannot achieve adequate development property for the production of high-density printed-wiring boards required for supporting the recent decrease in the size and weight of electronic devices.

There are more hardening compositions proposed to solve not only the flexibility problem but also the problem of electrical insulation property, such as a hardening composition using a photosensitive carboxyl resin obtained by the reaction of a novolac-type phenol resin with alkylene oxide, followed by the reaction of the obtained product with a polybasic acid anhydride (refer to Patent Document 6), or a hardening composition using a photosensitive carboxyl resin obtained by the reaction of a novolac-type phenol resin with either alkylene oxide or cyclic carbonate, followed by the reaction of the obtained product with a monocarboxylic acid containing an unsaturated group and a saturated aliphatic monocarboxylic acid and/or an aromatic monocarboxylic acid, and the reaction of the obtained product with a polybasic acid anhydride (refer to Patent Document 7). However, the development property of these compositions is rather low. Although a high-density printed-wiring board produced by using a resist made from those compositions is has an excellent electrical insulation property, it has a low level of hardness and also undergoes whitening.

Patent Document 1: Japanese Unexamined Patent Application Publication No. S61-243869

Patent Document 2: Japanese Unexamined Patent Application Publication No. H5-32746

Patent Document 3: Japanese Unexamined Patent Application Publication No. H11-65117

Patent Document 4: Japanese Unexamined Patent Application Publication No. H9-5997

Patent Document 5: Japanese Unexamined Patent Application Publication No. 2004-067815

Patent Document 6: International Publication No. WO 02/024774 A1

Patent Document 7: Japanese Unexamined Patent Application Publication No. 2005-91783

DISCLOSURE OF THE INVENTION

Problem to be Solved by the Invention

The present invention has been developed in view of the previously described problems. Its first objective is to provide a photo-setting or thermosetting resin that does not gelate, has an excellent development property, and is capable of forming an excellent hardened film that satisfies the requirements relating to the hardness, heat resistance, chemical resistance, electrical insulation property, flexibility and other properties. The second objective is to provide a hardening composition capable of forming a hardened film that is excellent in development property and other properties, such as the hardness, solder heat resistance, chemical resistance, adhesion property, PCT (pressure cooker test) resistance, electroless gold plating resistance, whitening resistance, electrical insulation property and flexibility.

Means for Solving the Problems

A carboxyl resin according to the present invention aimed at solving the previously described problems is characterized by having an acid value within a range from 20 to 200 mgKOH/g and being soluble in an organic solvent, the carboxyl resin being obtained by a process including the following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight.

An alkali developable hardening composition according to the present invention is characterized by including:

(A) a carboxyl resin having an acid value within a range from 20 to 200mgKOH/g and being soluble in an organic solvent, the carboxyl resin being obtained by a process including the following steps; epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight;

(B) a photosensitive (meta)acrylate compound; and (C) a photo-polymerization initiator.

Furthermore, the alkali developable hardening composition according to the present invention is also characterized by including (D) a carboxyl compound in addition to (A) the carboxyl resin, (B) the photosensitive (meta)acrylate compound and (C) the photo-polymerization initiator.

Specifically, in one preferable mode of the present invention, both monocarboxylic acids (b) and (f) are monocarboxylic acids containing an unsaturated group. In another mode, the monocarboxylic acid (b) is a monocarboxylic acid containing an unsaturated group while the monocarboxylic acid (f) is a monocarboxylic acid that does not contain any unsaturated group. It is also possible that the monocarboxylic acid (b) is a monocarboxylic acid that does not contain any unsaturated group while the monocarboxylic acid (f) is a monocarboxylic acid containing an unsaturated group. In these cases, when the monocarboxylic acid (b) and/or the monocarboxylic acid (f) is a monocarboxylic acid containing an unsaturated group, the monocarboxylic acid (b) and/or the monocarboxylic acid (f) is either acrylic acid or methacrylic acid. Furthermore, the resin (a) containing two or more epoxy groups in one molecule is a novolac-type epoxy resin, and the polybasic acid (d) is a carboxylic acid that is soluble in a reactant solvent and/or soluble in a solvent at a reaction temperature.

Effect of the Invention

According to the present invention, it is possible to obtain a hardened film that has sufficiently high development property for increasing the density of printed-wiring boards and is excellent in hardness, solder heat resistance, chemical resistance, adhesion property, PCT resistance, electroless gold plating resistance, whitening resistance, electrical insulation property, flexibility and other properties.

BEST MODE FOR CARRYING OUT THE INVENTION

Figure 1:
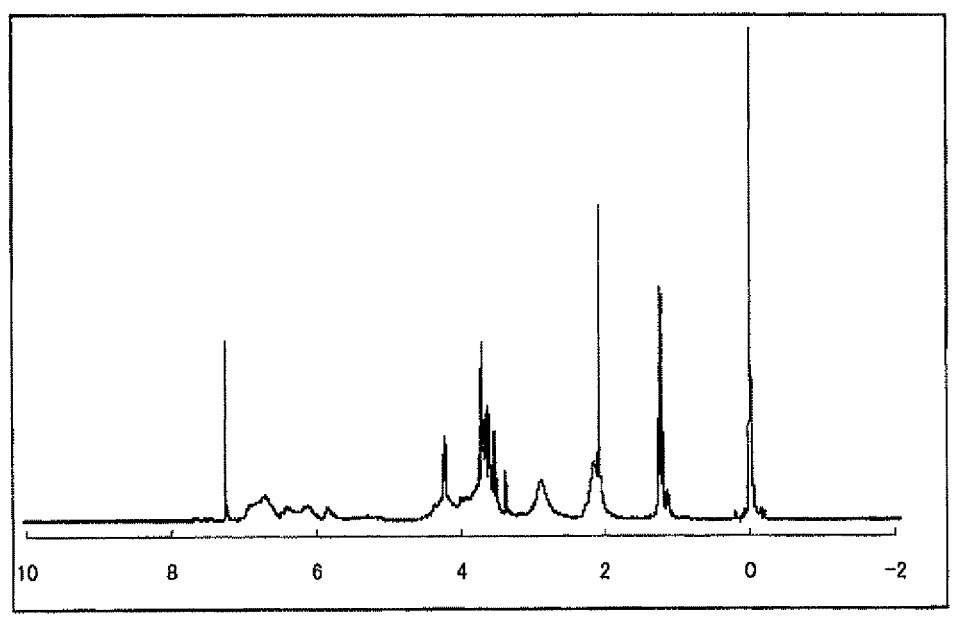
FIG. 1 is a nuclear magnetic resonance spectrum of a carboxyl resin as Synthesis Example 1 of First Embodiment (Solvent $CDC_3$; Reference Material TMS (tetramethylsilane).

As a result of intensive studies aimed at solving the previously described problems, the present inventors have completed the present invention based on the finding that a carboxyl resin that does not gelate, has an excellent development property and is capable of forming a hardened material having high levels of electrical insulation property, hardness, heat resistance, chemical resistance and flexibility, can be obtained by a process including the steps of partially adding a monocarboxylic acid to the epoxy groups on a resin having two or more epoxy groups in one molecule, then partially adding a polybasic acid to the remaining epoxy group or groups, and further adding a monocarboxylic acid to the remaining epoxy group or groups.

The present inventors have also completed the present invention based on the finding that a composition that contains the aforementioned carboxyl resin, a photosensitive (meta)acrylate compound and a photo-polymerization initiator, as well as a composition that contains the aforementioned carboxyl resin, a carboxyl compound, a photosensitive (meta) acrylate compound and a photo-polymerization initiator, have an excellent development property and can form a hardened material having high levels of hardness, solder heat resistance, chemical resistance, adhesion property, PCT resistance, electroless gold plating resistance, whitening resistance, electrical insulation property and flexibility.

In the process of producing the carboxyl resin according to the present invention, a monocarboxylic acid (b) is partially added to a resin (a) containing two or more epoxy groups in one molecule to obtain a reaction product (c), after which a polybasic acid (d) can be partially added to the epoxy groups on the reaction product (c) without causing gelation, and then a monocarboxylic acid (f) can be added to the remaining epoxy group or groups. It should be noted that the labels (a)-(f) are merely used for convenience and do not necessarily mean that different labels stand for different substances. For example, the monocarboxylic acids (b) and (f) may be the same kind of monocarboxylic acid, and each of them can be a mixture of two or more different kinds of monocarboxylic acids.

The partial addition of the polybasic acid (b) to the epoxy group or groups on the reaction product (c) gives a carboxyl group, where it is possible to perform a prereaction of one mol or more of the polybasic acid (d) to one epoxy-group equivalent weight of the reaction product (c). In this case, under certain reaction conditions, some of the epoxy groups can remain unreacted, leaving a mixture of the reaction product (e) and the polybasic acid (d), after which the reaction of the monocarboxylic acid (f) with the reaction product (e) in the aforementioned mixture can be performed. The resulting product is a mixture of a carboxyl resin according to the present invention, the unreacted portion of the polybasic acid (d) and the unreacted portion of the monocarboxylic acid (f). However, irrespective of the presence of the unreacted polybasic acid (d) and the unreacted monocarboxylic acid (f), the carboxyl resin according to the present invention exhibits excellent development property and can form a hardened material having high levels of electrical insulation property, hardness, heat resistance, chemical resistance and flexibility.

The carboxyl resin according to the present invention becomes a photo-setting resin when the monocarboxylic acid (b) and/or (f) is a monocarboxylic acid containing an unsaturated group. Furthermore, as a result of the previously described reactions of the resin (a) having two or more epoxy groups in one molecule, the monocarboxylic acid (b) and/or (f) and the polybasic acid (d), the carboxyl resin according to the present invention has a secondary alcoholic hydroxyl group on every side chain thereof. This structure is not only excellent in development property but also highly reactive since an unsaturated group or carboxyl group is present at the distal end of every side chain. A composition obtained by adding a photosensitive (meta)acrylate compound and a photo-polymerization initiator to the carboxyl resin according to the present invention, as well as a composition obtained by adding a carboxyl compound, a photosensitive (meta) acrylate compound and a photo-polymerization initiator to the carboxyl resin according to the present invention, can give a hardened material with a high crosslinking density and excellent properties.

More specifically, the carboxyl resin according to the present invention can be obtained by a process in which epoxy groups on a resin (a) having two or more epoxy groups in one molecule is made to react with 0.3-0.85 mol of a monocarboxylic acid (b) per one epoxy-group equivalent weight to obtain a reaction product (c), the epoxy group or groups on the reaction product (c) are made to react with 0.15-0.95 mol of a polybasic acid (d) per one epoxy-group equivalent weight to obtain a reaction product (e), and the epoxy group or groups on the reaction product (e) are further made to react with 1.0-5.0 mol of a monocarboxylic acid (f) per one epoxy-group equivalent weight. Each reaction can be easily performed in a solvent or under solventless condition, using a catalyst which will be mentioned later.

Examples of the resin (a) containing two or more epoxy groups in one molecule includes, but not limited to, the following products and compounds:

bisphenol A-type resins, such as the products marketed under the trade names of EPICOAT 828, EPICOAT 834, EPICOAT 1001, EPICOAT 1004 (manufactured by Japan Epoxy Resin Co., Ltd.), EPICLON 840, EPICLON 850, EPICLON 1050, EPICLON 2055(manufactured by DIC Corporation), EPO TOHTO YD-011, TD-013, YD-127, YD-128 (manufactured by Tohto Kasei Co., Ltd.), D.E.R. 317, D.E.R. 331, D.E.R. 661, D.E.R. 664 (manufactured by The Dow Chemical Company), SUMI-Epoxy ESA-011, ESA-014, ELA-115 and ELA-128(manufactured by Sumitomo Chemical Co., Ltd.);

brominated epoxy resins, such as the products marketed under the trade names of EPICOAT YL903(manufactured by Japan Epoxy Resin Co., Ltd.), EPICLON 152, EPICLON 165(manufactured by DIC Corporation), EPO TOHTO YDB-400, YDB-500(manufactured by Tohto Kasei Co., Ltd.), D.E.R. 542(manufactured by The Dow Chemical Company), SUMI-Epoxy ESB-400 and ESB-700(manufactured by Sumitomo Chemical Co., Ltd.);

novolac-type epoxy resins, such as the products marketed under the trade names of EPICOAT 152, EPICOAT 154 (manufactured by Japan Epoxy Resin Co., Ltd.), D.E.N. 431, D.E.N. 438(manufactured by The Dow Chemical Company), EPICLON N730, EPICLON N-770, EPICLON N-865 (manufactured by DIC Corporation), EPO TOHTO YDCN-701, YDCN-704(manufactured by Tohto Kasei Co., Ltd.), EPPN-201, EOCN-1025, EOCN-1020, EOCN-104S, RE-306(manufactured by Nippon Kayaku Co., Ltd.), SUMI-Epoxy ESCN-195X and ESCN-220(manufactured by Sumitomo Chemical Co., Ltd.); bisphenol F-type epoxy resins, such as the products marketed under the trade names of EPICLON 803(manufactured by DIC Corporation), EPICOAT 807(manufactured by Japan Epoxy Resin Co., Ltd.), and EPO TOHTO YDF-170, YDF-175and YDF-2004(manufactured by Tohto Kasei Co., Ltd.);

hydrogenated bisphenol A-type epoxy resins, such as the products marketed under the trade names of EPO TOHTO ST-2004, ST-2007 and ST-3000(manufactured by Tohto Kasei Co., Ltd.);

glycidylamine epoxy resins, such as the products marketed under the trade names of EPICOAT 604(manufactured by Japan Epoxy Resin Co., Ltd.), EPO TOHTO YH-434 (manufactured by Tohto Kasei Co., Ltd.), and SUMI-Epoxy ELM-120(manufactured by Sumitomo Chemical Co., Ltd.);

alicyclic epoxy resins, such as the products marketed under the trade name of CELLOXIDE 2021(manufactured by DAICEL CHEMICAL INDUSTRIES, LTD.);

trihydroxyphenyl-methane epoxy resins, such as the products marketed under the trade names of YL-933(manufactured by Japan Epoxy Resin Co., Ltd.), EPPN-501 and EPPN-502 (manufactured by Nippon Kayaku Co., Ltd.);

bixylenol-type or biphenol-type epoxy resins or their mixture, such as the products marketed under the trade names of YL-6056, YX-4000 and YL-6121(manufactured by Japan Epoxy Resin Co., Ltd.);

bisphenol S-type epoxy resins, such as the products marketed under the trade names of EBPS-200(manufactured by Nippon Kayaku Co., Ltd.), EPX-30(manufactured by ADEKA CORPORATION) and EXA-1514(manufactured by DIC Corporation);

bisphenol A novolac-type epoxy resin, such as the product marketed under the trade name of EPICOAT 157S (manufactured by Japan Epoxy Resin Co., Ltd.);

tetraphenylol ethane type epoxy resins, such as the product marketed under the trade name of EPICOAT YL-931(manufactured by Japan Epoxy Resin Co., Ltd.);

heterocyclic epoxy resins, such as the product marketed under the trade name of TEPIC (manufactured by Nissan Chemical Industries, Ltd.);

diglycidyl phthalate resins, such as the product marketed under the trade name of BLEMMER DGT (manufactured by NOF CORPORATION);

tetraglycigyl xylenoyl ethane resins, such as the product marketed under the trade name of ZX-1063(manufactured by Tohto Kasei Co., Ltd.);

epoxy resins containing a naphthalene group, such as the product marketed under the trade names of ESN-190, ESN-360(manufactured by Nippon Steel Chemical Co., Ltd.), HP-4032, EXA-4750 and EXA-4700(manufactured by DIC Corporation);

epoxy resins having a dicyclopentadiene skeleton, such as the products marketed under the trade names of HP-7200 and HP-7200H (manufactured by DIC Corporation);

glycidyl methacrylate copolymerization system epoxy resins, such as the products marketed under the trade names of CP-50S and CP-50M (manufactured by NOF CORPORATION);

epoxy resins obtained by copolymerization of cyclohexyl maleimide and glycidyl methacrylate;

polyfunctional epoxy resins obtained by the reaction of epihalohydrin with an alcoholic secondary hydroxyl group obtained by the reaction of 1,5-dihydroxynaphthalene with a bisphenol A-type epoxy resin (Japanese Unexamined Patent Application Publication. No. 2001-270930); and epoxy resin having 1,3-dioxolan ring obtained by adding a ketone to a portion of epoxy groups (Japanese Unexamined Patent Application Publication No. 2007-176987).

Each of these epoxy resins can be used separately, or two or more of them can be used in a mixed form.

Among these epoxy resins, the resins having three or more epoxy groups are particularly preferable.

In the process of partially adding the monocarboxylic acid (b) to the epoxy resin (a), it is preferable to perform the reaction in a solvent, using a polymerization inhibitor and a catalyst. The reaction temperature is preferably within a range from 50 to 150 degrees Celsius, and more preferably from 70 to 120 degrees Celsius. The reaction ratio of the monocarboxylic acid (b) to the epoxy resin (a) is within a range from 0.3 to 0.85 mol of the monocarboxylic acid (b) per one epoxy-group equivalent weight of the epoxy resin (a), and more preferably from 0.5 to 0.8 mol. If the monocarboxylic acid (b) is not within the range from 0.3 to 0.85 mol, gelation may occur in the subsequent reaction or the end product may have inadequate development property.

Representative examples of the monocarboxylic acid (b) are as follows:

monocarboxylic acids containing an unsaturated group, such as acrylic acid, methacrylic acid, crotonic acid, cinnamic acid, α-cyanocinnamic acid, β-styryl acrylic acid and β-furfuryl acrylic acid; saturated aliphatic monocarboxylic acids, such as formic acid, acetic acid, propionic acid, n-butyric acid, isobutyric acid, valerianic acid, trimethylacetic acid, caproic acid, caprylic acid, pelargonic acid, capric acid, undecylic acid, lauric acid, tridecylic acid, myristic acid, pentadecylic acid, palmitic acid, heptadecylic acid, stearic acid, nonadecanoic acid, arachidic acid, and behenic acid; and aromatic monocarboxylic acids, such as benzoic acid, alkyl benzoic acid, alkylamino benzoic acid, halogenated benzoic acid, phenylacetic acid, anisic acid, benzoylbenzoic acid, and naphthoic acid. Each of these monocarboxylic acids can be used separately, or two or more of them can be used in a mixed form. Among these compounds, acrylic acid, methacrylic acid and acetic acid are particularly preferable.

Examples of the reaction solvent are as follows:

ketones, such as methyl ethyl ketone and cyclohexanone;

aromatic hydrocarbons, such as toluene, xylene and tetramethyl benzene;

glycol ethers, such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether;

acetic esters, such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate;

alcohols, such as ethanol, propanol, ethylene glycol and propylene glycol;

aliphatic hydrocarbons, such as octane and decane; and petroleum solvents, such as petroleum ether, petroleum naphtha, hydrogenated petroleum naphtha, and solvent naphtha.

Each of these reaction solvents can be used separately, or two or more of them can be used in a mixed form.

Examples of the reaction catalysts include, but are not limited to, the following compounds: tertiary amines, such as triethyl amine; quaternary ammonium salts, such as triethyl benzyl ammonium chloride; imidazole compounds, such as 2-ethyl-4-methyl imidazole; phosphorus compounds, such as triphenylphosphine; metal salts of organic acids, such as lithium, chromium, zirconium, potassium or sodium salt of naphthenic acid, lauric acid, stearic acid, oleic acid or octenoic acid. Each of these catalysts can be used separately, or two or more of them can be used in a mixed form.

Examples of the polymerization inhibitors include, but are not limited to, the following compounds: hydroquinone, methyl hydroquinone, hydroquinone monomethyl ether, catechol, pyrogallol, and phenothiazine. Each of these compounds can be used separately, or two or more of them can be used in a mixed form.

The process of partially adding the polybasic acid (d) to the epoxy groups on the reaction product (c) is preferably performed at a reaction temperature within a range from 50 to 150 degrees Celsius, and more preferably from 70 to 120 degrees Celsius. The reaction ratio of the polybasic acid (d) to the reaction product (c) is within a range from 0.15 to 0.95 mol of the polybasic acid (d) per epoxy-group equivalent weight of the reaction product (c), and more preferably from 0.5 to 0.9 mol. If the monocarboxylic acid (d) is not within the range from 0.15 to 0.95 mol, gelation may occur during the reaction or the final product may have inadequate development property.

Representative examples of the polybasic acid (d) are oxalic acid, malonic acid, succinic acid, glutaric acid, adipic acid, pimelic acid, suberic acid, azelaic acid, sebacic acid, maleic acid, fumaric acid, phthalic acid, isophthalic acid, terephthalic acid, tetrahydrophthalic acid, methanetricarboxylic acid, tricarballylic acid, benzenetricarboxylic acid and benzenetetracarboxylic acid. Any one or more of these acids can be used. Among these examples, the compounds that are soluble in the reaction solvent or can be dissolved in the solvent at the reaction temperature are preferable as the polybasic acid (d). Specifically malonic acid, glutaric acid, maleic acid, tetrahydrophthalic acid and phthalic acid are preferable, among which maleic acid, tetrahydrophthalic acid and phthalic acid are particularly preferable.

The carboxyl resin according to the present invention is obtained by the addition of the monocarboxylic acid (b) to the epoxy resin (a), followed by the addition of the polybasic acid (d) and then the addition of the monocarboxylic acid (f) to the remaining epoxy group or groups. The purpose of adding the monocarboxylic acid (f) is to suppress the crosslinking reaction of the polybasic acid (d) with the reaction product (c). Therefore, the reaction time of the reaction product (c) and the polybasic acid (d) must not be long, otherwise the polybasic acid (d) may possibly act as a crosslinking agent for the reaction product (c). When the monocarboxylic acid (f) is a monocarboxylic acid containing an unsaturated group, the end product will have a photo-setting resin. The reaction temperature is preferably within a range from 50 to 150 degrees Celsius, and more preferably from 70 to 120 degrees Celsius. The reaction ratio of the monocarboxylic acid (f) is within a range from 1.0 to 5.0 mol to one wpoxy-group equivalent weight of the reaction product (e), and preferably from 1.01 to 2.0 mol. If the monocarboxylic acid (f) is less than 1.0 mol, the end product may possibly have inadequate development property due to gelation or polymerization. The total reacting amount of the epoxy resin (a), monocarboxylic acid (b), polybasic acid (d) and monocarboxylic acid (f) should be preferably within a range from 0.94 to 1 mol per epoxy-group equivalent weight of the epoxy resin (a). If the reacting amount is less than 0.94 mol, the end product may possibly have inadequate development property due to gelation or polymerization. The epoxy equivalent weight of the reaction product is preferably equal to or greater than 3000 g/eq., and more preferably equal to or greater than 5000 g/eq. If the epoxy equivalent weight is equal to or less than 3000 g/eq., it is possible that the reaction product either turns to a gel and becomes insoluble in organic solvents, or turns to a high polymer and prevents the end product from having adequate development property.

The acid value of the carboxyl resin is within a range from 20 to 200 mgKOH/g, and more preferably from 33 to 150 mgKOH/g. Within these ranges, the carboxyl resin according to the present invention becomes excellent not only in the development property but also in the other properties.

The alkali developable hardening composition according to the present invention is hereinafter described. The hardening composition according to the present invention is obtained either by mixing a photosensitive (meta)acrylate compound (B) and a photo-polymerization initiator (C) in the previously described carboxyl resin (A), or by mixing a carboxyl compound (D), a photosensitive (meta)acrylate compound (B) and a photo-polymerization initiator (C) in the previously described carboxyl resin (A). The term "(meta) acrylate" herein used is a general term for acrylate and metacrylate. Other similar expressions are also used as general terms.

The carboxyl compound (D) is a compound containing at least one carboxyl group in one molecule, and preferably two or more carboxyl groups. This compound is not limited to any specific kinds; both carboxyl compounds having no ethylenically unsaturated double bond in itself and photosensitive carboxyl compounds having an ethylenically unsaturated double bond can be used, Particularly suitable compounds are as listed below:

(1) a carboxyl compound obtained by copolymerization of an unsaturated carboxylic acid and a compound having an unsaturated double bond, (2) a photosensitive carboxyl compound obtained by adding, as a pendant, an ethylenically unsaturated group to a copolymer of an unsaturated carboxylic acid and a compound having an unsaturated double bond, (3) a photosensitive carboxyl compound obtained by the reaction of a saturated or unsaturated polybasic acid anhydride with a secondary hydroxyl group produced by the reaction of an unsaturated carboxylic acid with a copolymer of a compound having an epoxy group and an unsaturated double bond and another compound having an unsaturated double bond, (4) a photosensitive carboxyl compound obtained by the reaction of a compound having a hydroxyl group and an unsaturated double bond with a copolymer of an anhydride having an unsaturated double bond and a compound having an unsaturated double bond, (5) a photosensitive carboxyl compound obtained by an esterification reaction of epoxy groups on a polyfunctional epoxy compound having at least two epoxy groups in one molecule with a carboxyl group on an unsaturated monocarboxylic acid, followed by the reaction of the resulting hydroxyl group with a saturated or unsaturated polybasic acid anhydride, (6) a carboxyl compound obtained by the reaction of epoxy groups on a copolymer of a compound having an unsaturated double bond and a glycidyl (meta)acrylate with an organic acid having one carboxyl group and no ethylenically unsaturated bond in one molecule, followed by the reaction of the resulting secondary hydroxyl group with a saturated or unsaturated polybasic acid anhydride, (7) a carboxyl compound obtained by the reaction of a hydroxyl polymer with a saturated or unsaturated polybasic acid anhydride, (8) a photosensitive carboxyl compound obtained by the reaction of a hydroxyl polymer with a saturated or unsaturated polybasic acid anhydride to obtain a carboxyl compound, followed by the reaction of the obtained carboxyl compound with a compound having an epoxy group and an unsaturated double bond, (9) a photosensitive carboxyl compound obtained by the reaction of a saturated or unsaturated polybasic acid anhydride with a product of the reaction of a polyfunctional epoxy compound having at least two epoxy groups in one molecule, an unsaturated monocarboxylic acid, and a compound having at least two hydroxyl groups and another, non-hydroxyl reactive group capable of reacting with epoxy groups,

(10) a polycarboxylic acid urethane compound containing an unsaturated group, composed of: a product of the reaction of a polyfunctional epoxy compound having at least two epoxy groups in one molecule, an unsaturated monocarboxylic acid, and a compound having at least two hydroxyl groups and another, non-hydroxyl reactive group capable of reacting with epoxy groups; a saturated or unsaturated polybasic acid anhydride; and a monoisocyanate containing an unsaturated group,

(11) a photosensitive carboxyl compound obtained by the reaction of a saturated or unsaturated polybasic acid anhydride with a primary hydroxyl group on a modified oxetane compound obtained by the reaction of an unsaturated monocarboxylic acid with a polyfunctional oxetane compound having at least two oxetane ring in one molecule,

(12) a photosensitive carboxyl compound obtained by introducing an unsaturated double bond into a product of the reaction of a bisepoxy compound with a dicarobxylic acid, and subsequently making this product react with a saturated or unsaturated polybasic acidy anhydride,

(13) a photosensitive carboxyl compound obtained by introducing an unsaturated double bond into a product of the reaction a bisepoxy compound with a kind of bisphenol, and subsequently making this product react with a saturated or unsaturated polybasic acid anhydride, and

(14) a photosensitive carboxyl compound obtained by making an unsaturated monocarboxylic acid react with a product of the reaction of a novolac-type phenol resin with alkylene oxide and/or cyclic carbonate, and subsequently making the resulting product react with a saturated or unsaturated polybasic acid anhydride.

The compositional ratio of the carboxyl resin (A) and the carboxyl compound (D), A:D, is preferably within a range from 20:80 to 80:20 in mass ratio, and more preferably from 30:70 to 70:30. If A:D is outside the range from 20:80 to 80:20, the resulting product may possibly have insufficient properties. The acid value of the carboxyl resin (A) and the carboxyl compound (D) is within a range from 20 to 200 mgKOH/g, and more preferably 33 to 150 mgKOH/g. Within these ranges, the hardening composition according to the present invention becomes excellent not only in development property but also in the other properties.

Examples of the photosensitive (meta)acrylate compound (B) are as follows:

hydroxyl acrylates, such as 2-hydroxyethyl (meta)acrylate, 2-hydroxypropyl (meta)acrylate, pentaerythritol triacrylate, and dipentaerythritol pentaacrylate;

water-soluble acrylates, such as polyethylene glycol diacrylate and polypropylene glycol diacrylate;

polyfunctional polyester acrylates of polyalcohols, such as trimethylolpropane tri(meta)acrylate, pentaerythritol tetraacrylate, and dipentaerythritol hexaacrylate;

acrylates of ethylene oxide adducts and/or propylene oxide adducts of polyfunctional alcohols (e.g. trimethylolpropane or hydrogenated bisphenol A) or polyhydric phenols (e.g. bisphenol A or biphenol);

polyfunctional or monofunctional polyurethane acrylates obtained as isocyanate-modified products of the aforementioned hydroxyl acrylates;

epoxy acrylates obtained as (meta)acrylic acid adducts of bisphenol A diglycidyl ether, hydrogenated bisphenol A diglycidyl ether or phenol novolac epoxy resins;

caprolactone-modified acrylates, such as caprolactone-modified ditrimethylolpropane tetraacrylate, an acrylate of $\epsilon$-caprolactone-modified dipentaerythritol, and caprolactone-modified hydroxy pivalic acid neopentylglycol ester diacrylate; and methacrylates corresponding to the above-listed acrylates.

Each of these compounds can be used separately, or two or more of them can be combined. Among those examples, polyfunctional (meta)acrylate compounds having two or more (meta)acryloyl groups in one molecule are particularly preferable. The purpose of using these photosensitive (meta)acrylates is to improve the photo-reactivity of the carboxyl resin (A), and also to improve the photo-reactivity of the mixture of the carboxyl resin (A) and the carboxyl compound (D). Photosensitive (meta)acrylate compounds that are in a liquid state at room temperature not only improve photo-reactivity but also act as an agent for adjusting the viscosity of the composition to appropriate levels for various application methods and for helping the dissolution of the composition in an aqueous alkaline solution. However, using an excessive amount of photosensitive (meta)acrylate compound that is in a liquid state at room temperature is not preferable since it results in a coating film having no set-to-touch property and also tends to deteriorate the properties of the film. The mixture ratio of the photosensitive (meta)acrylate compound (B) is preferably equal to or lower than 100 parts by mass to 100 parts by mass of the carboxyl resin (A). When the hardening composition according to the present invention contains the carboxyl compound (D), the mixture ratio of the photosensitive (meta)acrylate compound (B) is preferably equal to or lower than 100 parts by mass to 100 parts by mass of the mixture of the carboxyl resin (A) and the carboxyl compound (D).

Examples of the photo-polymerization initiator are as follows:

benzoin and benzoin alkyl ethers, such as benzoin, benzoin methyl ether, benzoin ethyl ether, and benzoin isopropyl ether;

acetophenones, such as acetophenone, 2,2-dimethoxy-2-phenylacetophenone, 2,2-diethoxy-2-phenylacetophenone, and 1;1-dichloroacetophenone;

aminoacetophenones, such as 2-methyl-1-[4-(methylthio) phenyl]-2-morphol inopropane-1-one, 2-benzyl-2-dimethylamino-1-(4-morpholinophenyl)-buthane-1-one, and N,N-dimethylaminoacetophenone;

anthraquinones, such as 2-methyl anthraquinone, 2-ethyl anthraquinone, 2-t-butyl anthraquinone, and 1-chloro anthraquinone;

thioxanthones, such as 2,4-dimethyl thioxanthone, 2,4-diethyl thioxanthone, 2-chloro thioxanthone, and 2,4-diisopropyl thioxanthone;

ketals, such as acetophenone dimethyl ketal and benzyldimethyl ketal;

organic peroxides, such as benzoyl peroxide and cumene peroxide;

2,4,5-triaryl imidazole dimer;

riboflavine tetrabutyrate;

thiol compounds, such as 2-mercaptobenzoimidazole, 2-mercaptobenzooxazole, and 2-mercaptobenzothiazole;

organic halogen compounds, such as 2,4,6-tris-s-triazine, 2,2,2-tribromoethanol and tribromomethylphenyl sulfone;

benzophenones or xanthones, such as benzophenone and 4,4'-bisdiethylamino benzophenone; and 2,4,6-trimethylbenzoildiphenyl phosphine oxide.

Each of these publicly known, commonly used photo-polymerization initiators can be used separately, or two or more of them can be used in a mixed form. It is also possible to add a photo-initiation assistant, such as tertiary amines, examples of which include N,N-dimethylamino benzoic ethyl ester, N,N-dimethylamino benzoic isoamyl ester, pentyl-4-dimethylamino benzoate, triethylamine and triethanolamine. Furthermore, it is also possible to add a titanocene compound that absorbs light within the visible light range (e.g. CGI-784, manufactured by Ciba Specialty Chemicals K.K.) so as to improve the photo reaction. Particularly preferable photo-polymerization initiators include, but not limited to, 2,4,6-trimethylbenzoildiphenyl phosphine oxide, 2-methyl-1-[4-(methylthio)phenyl]-2-morpholinopropane-1-one, and 2-benzyl-2-dimethylamino-1-(4-morpholinophenyl)-butane-1-one. Any compounds that absorb light within the ultraviolet or visible light range and cause radical polymerization of (meta)acryloyl group or other unsaturated groups can be used not only separately but also in combination of two or more of them, regardless of whether they are used as photo-polymerization initiator or photo-initiation assistant. The usage of the photo-polymerization initiator (C) should be preferably within a range from 0.5 to 25 parts by mass to 100 parts by mass of the carboxyl resin (A) (the total amount, or the single amount if only one resin is used). If the hardening composition according to the present invention contains the carboxyl compound (D), the usage of the photo-polymerization initiator (C) should be preferably within a range from 0.5 to 25 parts by mass to 100 parts by mass of the mixture of the carboxyl resin (A) and the carboxyl compound (D).

It is also possible to mix a thermo-setting component in the hardening composition according to the present invention for the purpose of promoting the thermo-setting property of the carboxyl resin or the thermo-setting property of the mixture of the carboxyl resin and carboxyl compound. Any kind of thereto-setting component may be used for this purpose as long as it reacts with the carboxyl group of the carboxyl resin or the carboxyl group of the carboxyl resin and the carboxyl compound by heat. For example, epoxy resins and oxetane resins are generally used.

Examples of the epoxy resin include the following products and compounds:

bisphenol A-type resins, such as the products marketed under the trade names of EPICOAT 828, EPICOAT 834, EPICOAT 1001, EPICOAT 1004(manufactured by Japan Epoxy Resin Co., Ltd.), EPICLON 840, EPICLON 850, EPICLON 1050, EPICLON 2055(manufactured by DIC Corporation), EPO TOHTO YD-011, TD-013, YD-127, YD-128 (manufactured by Tohto Kasei Co., Ltd.), D.E.R. 317, D.E.R. 331, D.E.R. 661, D.E.R. 664 (manufactured by The Dow Chemical Company), SUMI-Epoxy ESA-011, ESA-014, ELA-115 and ELA-128(manufactured by Sumitomo Chemical Co., Ltd.);

brominated epoxy resins, such as the products marketed under the trade names of EPICOAT YL903(manufactured by Japan Epoxy Resin Co., Ltd.), EPICLON 152, EPICLON 165(manufactured by DIC Corporation), EPO TOHTO YDB-400, YDB-500(manufactured by Tohto Kasei Co., Ltd.), D.E.R. 542(manufactured by The Dow Chemical Company), SUMI-Epoxy ESB-400 and ESB-700 (manufactured by Sumitomo Chemical Co., Ltd.);

novolac-type epoxy resins, such as the products marketed under the trade names of EPICOAT 152, EPICOAT 154 (manufactured by Japan Epoxy Resin Co., Ltd.), D.E.N. 431, D.E.N. 438(manufactured by The Dow Chemical Company), EPICLON N730, EPICLON N-770, EPICLON N-865 (manufactured by DIC Corporation), EPO TOHTO YDCN-701, YDCN-704(manufactured by Tohto Kasei Co., Ltd.), EPPN-201, EOCN-1025, EOCN-1020, EOCN-104S, RE-306(manufactured by Nippon Kayaku Co., Ltd.), SUMI-Epoxy ESCN-195X and ESCN-220(manufactured by Sumitomo Chemical Co., Ltd.); bisphenol F-type epoxy resins, such as the products marketed under the trade names of EPICLON 803(manufactured by DIC Corporation), EPICOAT 807(manufactured by Japan Epoxy Resin Co., Ltd.), and EPO TOHTO YDF-170, YDF-175 and YDF-2004(manufactured by Tohto Kasei Co., Ltd.);

hydrogenated bisphenol A-type epoxy resins, such as the products marketed under the trade names of EPO TOHTO ST-2004, ST-2007 and ST-3000(manufactured by Tohto Kasei Co., Ltd.);

glycidylamine epoxy resins, such as the products marketed under the trade names of EPICOAT 604(manufactured by Japan Epoxy Resin Co., Ltd.), EPO TOHTO YH-434 (manufactured by Tohto Kasei Co., Ltd.), and SUMI-Epoxy ELM-120(manufactured by Sumitomo Chemical Co., Ltd.);

alicyclic epoxy resins, such as the products marketed under the trade name of CELLOXIDE 2021(manufactured by DAICEL CHEMICAL INDUSTRIES, LTD.);

trihydroxyphenyl-methane epoxy resins, such as the products marketed under the trade names of YL-933(manufactured by Japan Epoxy Resin Co., Ltd.), EPPN-501 and EPPN-502 (manufactured by Nippon Kayaku Co., Ltd.);

bixylenol-type or biphenol-type epoxy resins or their mixture, such as the products marketed under the trade names of YL-6056, YX-4000 and YL-6121(manufactured by Japan Epoxy Resin Co., Ltd.);

bisphenol S-type epoxy resins, such as the products marketed under the trade names of EBPS-200(manufactured by Nippon Kayaku Co., Ltd.), EPX-30(manufactured by ADEKA CORPORATION) and EXA-1514(manufactured by DIC Corporation);

bisphenol A novolac-type epoxy resin, such as the product marketed under the trade name of EPICOAT 157S (manufactured by Japan Epoxy Resin Co., Ltd.);

tetraphenylol ethane type epoxy resins, such as the product marketed under the trade name of EPICOAT YL-931(manufactured by Japan Epoxy Resin Co., Ltd.);

heterocyclic epoxy resins, such as the product marketed under the trade name of TEPIC (manufactured by Nissan Chemical Industries, Ltd.);

diglycidyl phthalate resins, such as the product marketed under the trade name of BLEMMER DGT (manufactured by NOF CORPORATION);

tetraglycigyl xylenoyl ethane resins, such as the product marketed under the trade name of ZX-1063(manufactured by Tohto Kasei Co., Ltd.);

epoxy resins containing a naphthalene group, such as the product marketed under the trade names of ESN-190, ESN- 360(manufactured by Nippon Steel Chemical Co., Ltd.), HP-4032, EXA-4750 and EXA-4700(manufactured by DIC Corporation);

epoxy resins having a dicyclopentadiene skeleton, such as the products marketed under the trade names of HP-7200 and HP-7200H (manufactured by DIC Corporation);

glycidyl methacrylate copolymerization system epoxy resins, such as the products marketed under the trade names of CP-50S and CP-50M (manufactured by NOF CORPORATION);

hydantoin-type epoxy resins;

epoxy resins obtained by the copolymerization of cyclohexyl maleimide and glycidyl methacrylate;

polyfunctional epoxy resins obtained by the reaction of epihalohydrin with an alcoholic secondary hydroxyl group obtained by the reaction of 1,5-dihydroxynaphthalene with a bisphenol A-type epoxy resin (Japanese Unexamined Patent Application No. 2001-270930); and epoxy resin having 1,3-dioxolan ring obtained by adding a ketone to a portion of epoxy groups.

Examples of the oxetane resins include the following compounds:
3,7-bis(3-oxetanyl)-5-oxa-nonan,
3,3'-(1,3-(2-methylenyl)propanediylbis(oxymethylene))bis-(3-ethyloxetane),
1,4-bis[(3-ethyl-3-oxetanylmethoxy)methyl]benzene,
1,2-bis[(3-ethyl-3-oxetanylmethoxy)methyl]ethane,
1,3-bis[(3-ethyl-3-oxetanylmethoxy)methyl]propane,
ethyleneglycolbis(3-ethyl-3-oxetanylmethyl)ether,
dicyclopentenylbis(3-ethyl-3-oxetanylmethyl)ether,
triethyleneglycolbis(3-ethyl-3-oxetanylmethyl)ether,
tetraethyleneglycolbis(3-ethyl-3-oxetanylmethyl)ether,
tricyclodecanediyldimethylene(3-ethyl-3-oxetanylmethyl)ether,
trimethylolpropanetris(3-ethyl-3-oxetanylmethyl)ether,
1,4-bis(3-ethyl-3-oxetanylmethoxy)bunane, 1,6-bis(3-ethyl-3-oxetanylmethoxy)hexane,
pentaerythritoltris(3-ethyl-3-oxetanylmethyl)ether, and
pentaerythritoltetrakis(3-ethyl-3-oxetanylmethyl)ether.

Each of the above-listed thermo-setting components can be used separately, or two or more of them can be combined. These thermo-setting components improve the adhesion, heat resistance and other properties of a resist by thereto-setting with the carboxyl resin (A) or thermo-setting with the mixture of the carboxyl resin (A) and the carboxyl compound (D). Their mixture ratio only needs to be within a range from 10 to 100 parts by mass, and preferably from 15 to 60 parts by mass, to 100 parts by mass of the carboxyl resin (A) or 100 parts by mass of the mixture of the carboxyl resin (A) and the carboxyl component (D). If the mixture ratio of the thermo-setting component is lower than the aforementioned range, the moisture absorption of the resulting hardened film will increase, causing its PCT resistance to easily decrease. Furthermore, the solder heat resistance and electroless plating resistance of the film will also tend be low. On the other hand, setting the mixture ratio to a level higher than the aforementioned range deteriorates the development property of the coating film and the electroless plating resistance of the hardened film, and also causes their PCT resistance to be considerably low. For electronic materials, the thermo-setting component should be preferably an epoxy resin, and more preferably a polyfunctional epoxy resin having two or more epoxy groups in one molecule.

It is also possible to add an organic solvent to the hardening composition according to the present invention in order to dissolve the carboxyl resin (A), the carboxyl compound (D) and the thermo-setting component, or to adjust the viscosity of the composition to an appropriate level for its application method.

Examples of the organic solvents are as follows:

aromatic hydrocarbons, such as toluene, xylene and tetramethyl benzene;

glycol ethers, such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether;

acetic esters, such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate;

alcohols, such as ethanol, propanol, ethylene glycol and propylene glycol;

aliphatic hydrocarbons, such as octane and decane; and petroleum solvents, such as petroleum ether, petroleum naphtha, hydrogenated petroleum naphtha, and solvent naphtha.

Each of these organic solvents can be used separately, or two or more of them can be used in a mixed form. The mixture ratio of the organic solvent may be arbitrarily determined according to the intended application or other conditions.

It is also possible to mix a thermo-setting catalyst in the hardening composition according to the present invention. Examples of the thermo-setting catalysts are as follows:

imidazole derivatives, such as imidazole, 2-methylimidazole, 2-ethylimidazole. 2-ethyl-4-methylimidazole, 2-phenylimidazole, 4-pheynlimidazole, 1-cyanoethyl-2-phenylimidazole, and 1-(2-cyanoethyl)-2-ethyl-4-methylimidazole;

amine compounds, such as dicyandiamide, benzyldimethylamine, 4-(dimethylamino)-N,N-dimethylbenzylamine, 4-methoxy-N,N-diemethylbenzylamine, and 4-methyl-N,N-dimethylbenzylamine;

hydrazine compounds, such as adipic acid hydrazide and sebacic acid hydrazide; and phosphorus compounds, such as triphenylphosphine.

Examples of commercial products include the products marketed as: 2MZ-A, 2MZ-OK, 2PHZ, 2P4BHZ, 2P4MHZ (all of which are imidazole compounds manufactured by Shikoku Chemicals Corporation), U-CAT3503N, U-CAT3502T (both of which are blocked isocyanate compounds of dimethylamine manufactured by San-Apro Ltd.), DBU, DBN, U-CATSA102 and U-CAT5002 (both of which are bicyclic amidine compounds manufactured by San-Apro Ltd.).

The choices are not limited to these examples if the catalyst is particularly used to improve thermo-setting property; any catalyst that hardens a compound having cyclic ether or promotes the reaction of a compound having cyclic ether with a carboxylic acid may be used. Each of the catalysts may be used separately, or two or more of them may be combined. It is also possible to use S-triazine derivatives, which also function as a tackifier. Examples of the S-triazine derivatives include guanamine, acetoguanamine, benzoguanamine, melamine, 2,4-diamino-6-methacryloyloxyethyl-S-triazine, 2-vinyl-4,6-diamino-S-triazine, and 2-vinyl-4,6-diamino-S-triazine isocyanuric acid adduct. It is preferable to use these compounds with the aforementioned hardening catalyst. The mixture ratio of the hardening catalyst only needs to be at a normal ratio, e.g. within a range from 0.1 to 20 parts by mass, and more preferably from 0.5 to 15.0 parts by mass, to 100 parts by mass of the carboxyl resin (A) or 100 parts by mass of the mixture of the carboxyl resin (A) and the carboxyl compound (D).

If necessary, it is possible to further add one or more kinds of publicly known, commonly used inorganic fillers, such as barium sulfate, barium titanate, amorphous silica, crystalline silica, molten silica, spherical silica, talc, clay, magnesium carbonate, calcium carbonate, aluminum oxide, aluminum hydroxide, and mica. These fillers are used in order to suppress the shrinkage on curing of the coating film and improve its adhesion, hardness and other properties. The mixture ratio of the inorganic filler should be within a range from 10 to 300 parts by mass, and more preferably from 30 to 200 parts by mass, to 100 parts by mass of the carboxyl compound (A) or 100 parts by mass of the mixture of the carboxyl resin (A) and the carboxyl compound (D).

If necessary, it is possible to further mix various kinds of publicly known, commonly used additives in the hardening composition according to the present invention. Examples of such additives include: colorants, such as phthalocyanine blue, phthalocyanine green, iodine green, disazo yellow, crystal violet, titanium oxide, carbon black and naphthalene black; thermo-polymerization inhibitors, such as hydroquinone, hydroquinone monomethyl ether, t-butylcatechol, pyrogallol and phenothiazine; thickeners, such as finely-divided silica, organic bentonite and montmorillonite; anti-foaming agents and/or leveling agents, such as silicon-based, fluorine-based and polymer-based ones; and silane coupling agents, such as imidazole-based, thiazole-based and triazole-based ones.

If necessary, it is possible to further mix a flame retardant, such as a halogen-based, phosphorus-based or antimony-based flame retardant, in the hardening composition according to the present invention in order to obtain a flame-retardant product. The mixture ratio of the flame retardant is normally within a range from 1 to 200 parts by mass, and more preferably from 5 to 50 pasts by mass, to 100 parts by mass of the carboxyl resin (A) or 100 parts by mass of the mixture of the carboxyl resin (A) and the carboxyl compound (D). Setting the mixture ratio of the flame retardant within the aforementioned range is preferable since the flame retardance, solder heat resistance and electrical insulation property of the resulting composition will be well-balanced at high levels.

It is also possible to add water to the hardening composition according to the present invention in order to lower its flammability. In the case of adding water, it is preferable to form a salt by the reaction of the carboxyl group of the carboxyl resin (A) with trimethylamine, triethylamine or similar amines, or with a (meta)acrylate resin having a tertiary amino group, such as N,N-dimethylaminoethyl(meta) acrylate, N,N-dimethylaminopropyl(meta)acrylamide, or acryloyl morpholine, so that the hardening composition of the present invention will be easy to blend with water.

The hardening composition according to the present invention may be used to create a dry film including a base sheet on which a layer of the aforementioned hardening composition is formed. It is preferable to further form a peel-off cover film on the hardening composition layer of the aforementioned film.

A plastic film is used as the base sheet. Preferable examples of the plastic film include polyester films (e.g. polyethylene terephthalate), polyimide films, polyamideimide films, polypropylene films and polystylene films. The thickness of the base sheet may be appropriately selected within a range from 10 to 150 µm.

The composition layer on the base sheet can be obtained by applying the aforementioned hardening composition with a uniform thickness on the base sheet by means of a comma coater, blade coater, LIP coater, rod coater, squeeze coater, reverse coater, transfer roll coater or similar machine, and then heating and/or drying the composition to volatilize the solvent. Its thickness is not limited to specific values and can be appropriately selected within a range from 10 to 150 µm.

The cover film may be made of a generally used film, such as a polyethylene film, polypropylene film, teflon® film or a sheet of surface-treated paper. Any type of cover film can be used as long as it satisfies the requirement that the adhesion between the hardening composition layer and the cover film should be weaker than that between the hardening composition layer and the base sheet.

The hardening composition according to the present invention having the previously described compositions may be diluted, as needed, to achieve an appropriate viscosity for an application method. The diluted composition may be applied to a printed-wiring board with a pre-formed circuit by screen printing, curtain coating, spray coating, roll coating or other methods, after which a tack-free film can be formed by heating the composition, for example, at approximately 60 to 100 degrees Celsius to volatize the organic solvent. In the case of a dry film including a base sheet on which a layer made of the aforementioned hardening composition is formed, a coating film can be formed on a printed-wiring board having a pre-formed circuit by applying the dry film on the printed-wiring board by means of a hot roll laminator or similar machine with the hardening composition layer being in contact with the printed-wiring board. In the case where the dry film is further provided with a releasable cover film on the hardening composition layer, a coating film can be formed on a printed-wiring board having a pre-formed circuit by releasing the cover film from the dry film and then applying the dry film on the printed-wiring board by means of a hot roll laminator or similar machine with the hardening composition layer being in contact with the printed-wiring board.

After the coating film is formed on the printed-wiring board having a pre-formed circuit (and without removing the base sheet when the dry film is used), a resist pattern can be created either by casting a laser beam or similar active energy beam so as to directly draw the intended pattern, or by selectively exposing specific portions on the board to an active energy beam cast onto the board through a photomask having the intended pattern and then developing the unexposed portions with a diluted aqueous alkali solution (when the dry film is used, the base sheet is removed after the exposure process and before the development process). Subsequently, a hardened film (product) is formed either by a thermo-setting process only or by a final (full) hardening process in which an active energy beam irradiation step and a thermo-setting step are performed in this order or reversed order. The resulting hardening film is excellent in electrical insulation property, PCT resistance, adhesion property, solder heat resistance, chemical resistance, electroless gold plating resistance and other properties.

Examples of the aforementioned aqueous alkali solution include aqueous alkali solutions of potassium hydroxide, sodium hydroxide, sodium carbonate, potassium carbonate, sodium phosphate, sodium silicate, ammonia and amines.

Irradiation light sources suitable for the photo-setting process include a low-pressure mercury lamp, middle-pressure mercury lamp, high-pressure mercury lamp, ultra-high pressure mercury lamp, xenon lamp, and metal halide lamp. A laser beam or the like may also be used as the active energy beam.

Specific examples of the carboxyl resin and the hardening composition according to the present invention are hereinafter described by means of synthesis examples and composition examples. It should be noted that the present invention is not limited to the following synthesis/composition examples. The term "parts" used in the following descriptions means "parts by mass" unless otherwise noted.

EXAMPLE 1

Synthesis of Carboxyl Resins

Synthesis Example 1

Figure 2:
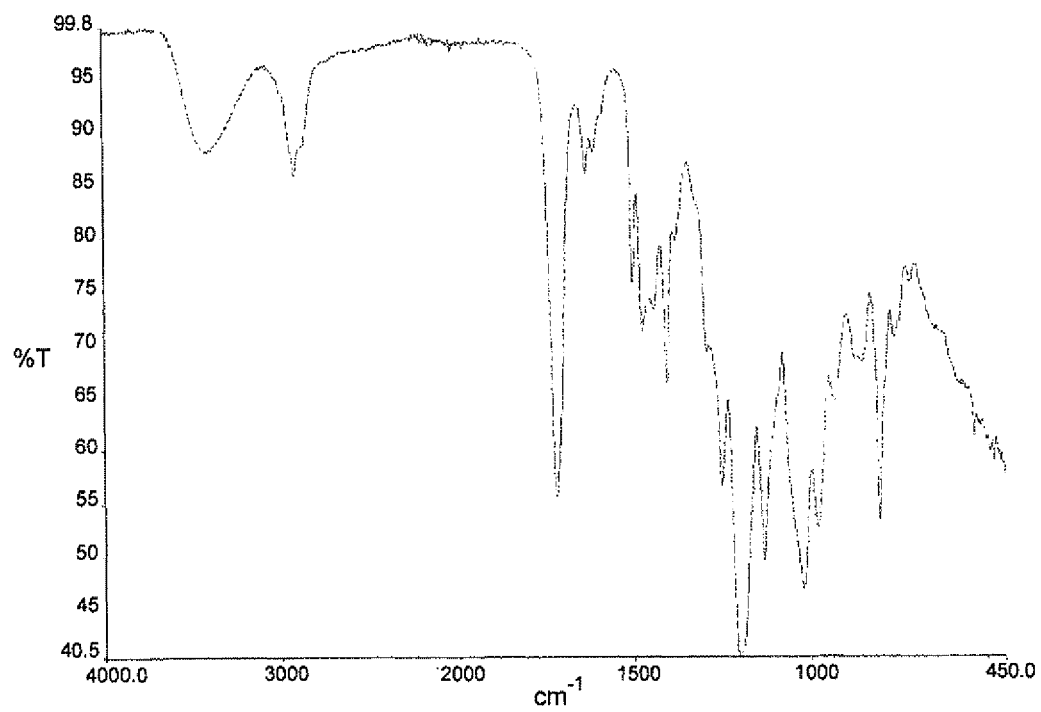
FIG. 2 is an infrared absorption spectrum of the carboxyl resin of Synthesis Example 1.
Figure 3:
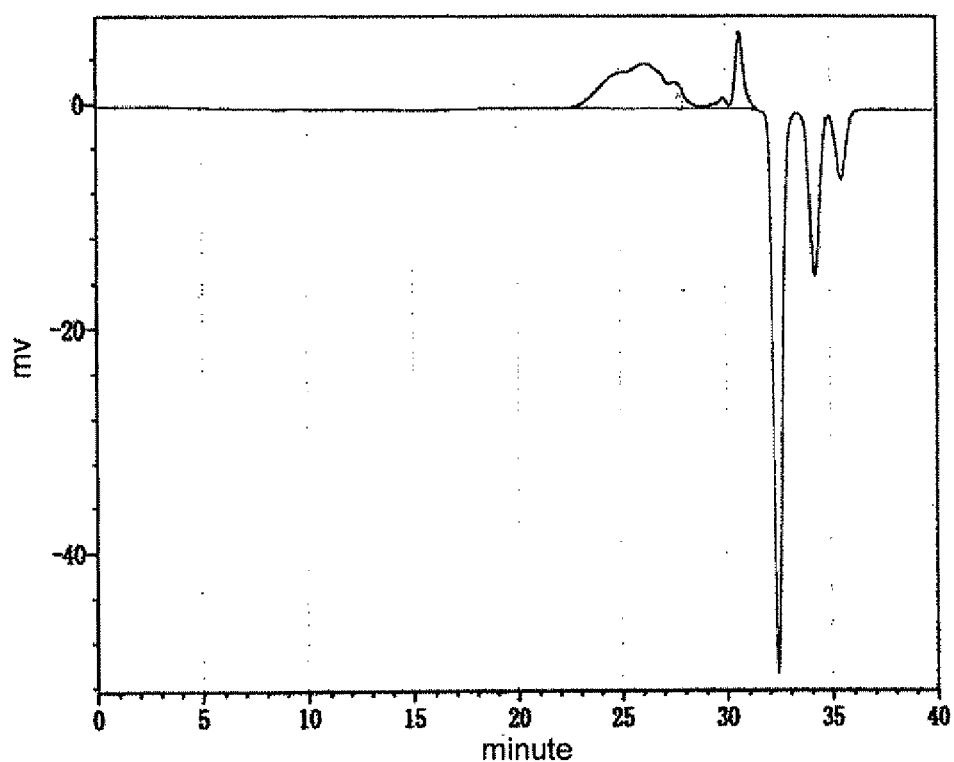
FIG. 3 is a chromatogram obtained by a gel permeation chromatography of the carboxyl resin of Synthesis Example 1.

A cresol novolac-type epoxy resin YDCN-700-5 (manufactured by Tohto Kasei Co., Ltd.; epoxy equivalent weight: 203) (203 parts) was put in a reaction container having a thermometer, stirrer, reflux condenser and air-blowing tube, to which diethylene glycol monoethyl ether acetate (291 parts) was added, and the mixture was dissolved by heat. Next, acrylic acid (36 parts), methyl hydroquinone (0.2 parts) and triphenylphosphine (3 parts) were added, and the mixture was subjected to a 3-hour reaction at 95-105 degrees Celsius, with air continuously blown into it. Subsequently, maleic acid (46.4 parts) and methyl hydroquinone (0.3 parts) were added, and the mixture was subjected to a 2-hour reaction at 95-105 degrees Celsius, followed by the addition of acetic acid (8.4 parts) and a 4-hour reaction at 95-105 degrees Celsius. As a result, a solution with a nonvolatile content of 50% was obtained. This solution was a mixture of a carboxyl resin and acetic acid, with an acid value of 88 mgKOH/g and epoxy-equivalent weight of 9836 g/eq. This solution is hereinafter referred to as "A-1." A $^1$H-NMR spectrum, IR spectrum and gel chromatogram of the obtained mixture of the carboxyl resin and acetic acid are shown in FIGS. 1-3, respectively.

Synthesis Example 2

Figure 4:
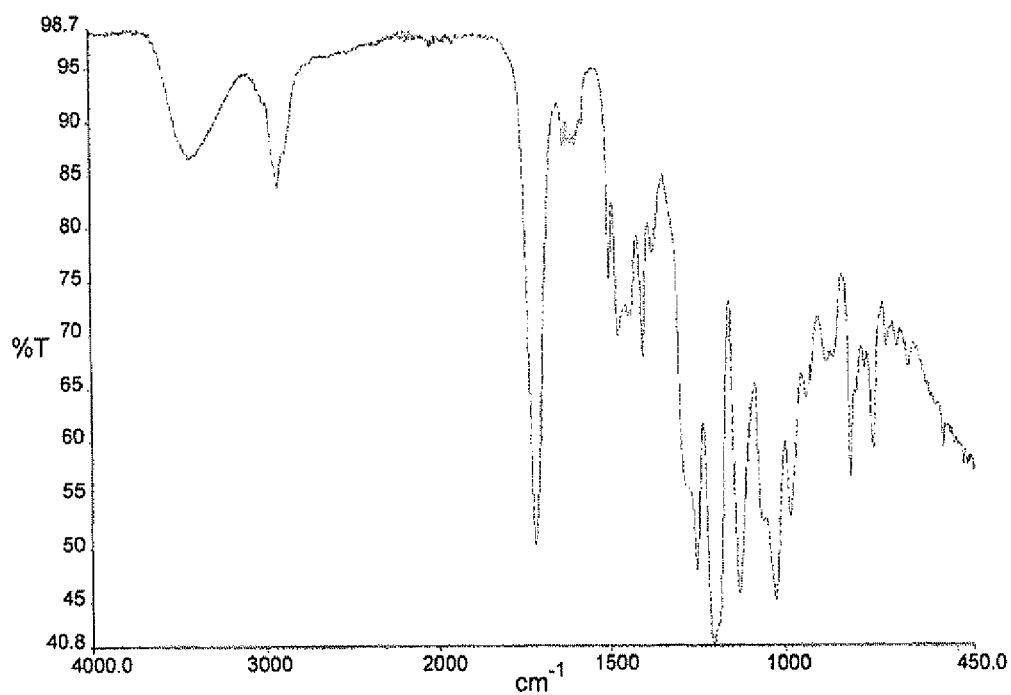
FIG. 4 is an infrared absorption spectrum of a carboxyl resin of Synthesis Example 2.
Figure 5:
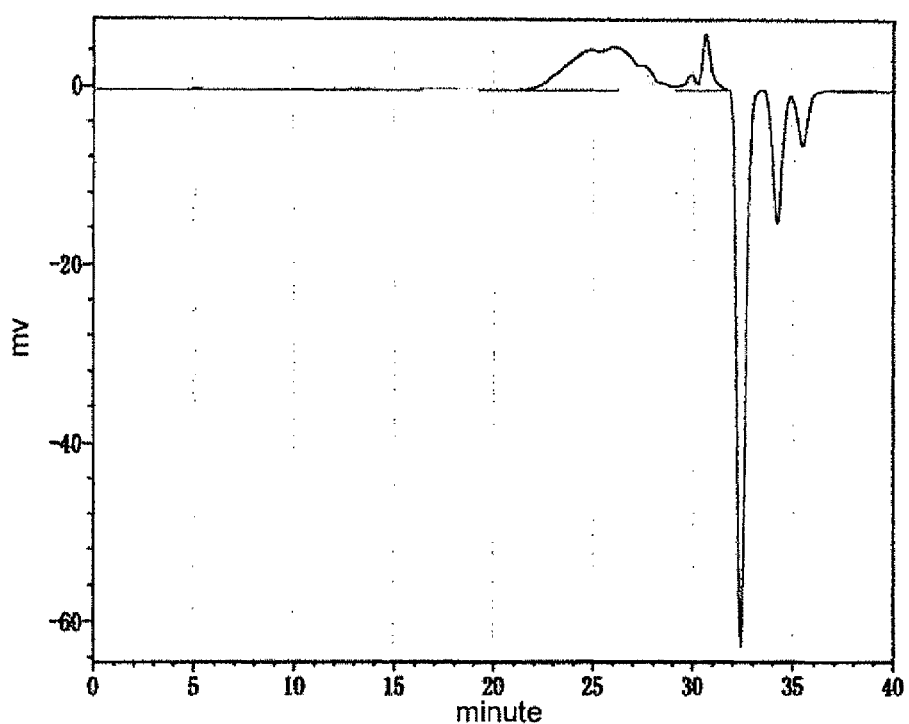
FIG. 5 is a chromatogram obtained by a gel permeation chromatography of the carboxyl resin of Synthesis Example 2.

The reactions in Synthesis Example 1 were similarly performed, using phthalic acid (66.4 parts) in place of maleic acid (46.4 parts), and a solution with a nonvolatile content of 52% was obtained. This solution was a mixture of a carboxyl resin and acetic acid, with an acid value of 84 mgKOH/g and epoxy-equivalent weight of 5465 g/eq. This solution is hereinafter referred to as "A-2." An IR spectrum and gel chromatogram of the obtained mixture of the carboxyl resin and acetic acid are shown in FIGS. 4 and 5, respectively.

Synthesis Example 3

Figure 6:
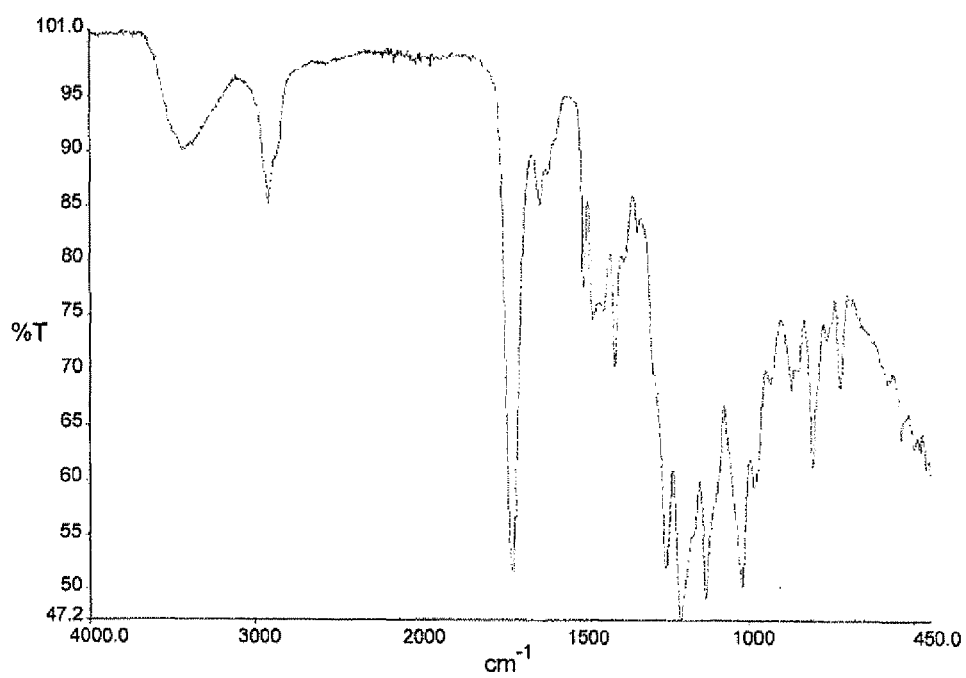
FIG. 6 is an infrared absorption spectrum of a carboxyl resin of Synthesis Example 3.
Figure 7:
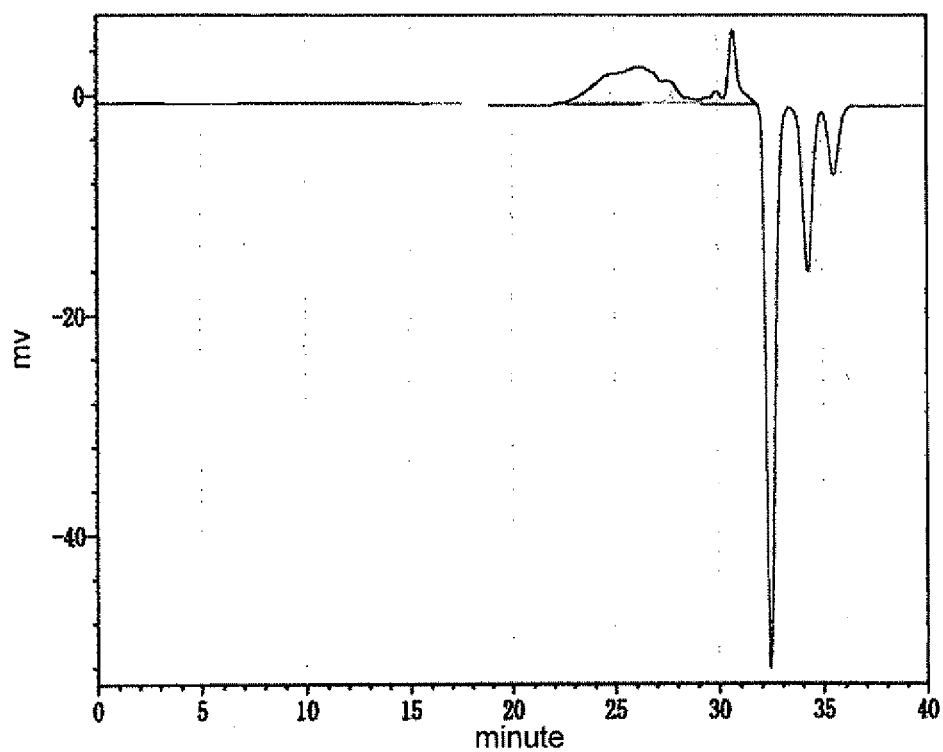
FIG. 7 is a chromatogram obtained by a gel permeation chromatography of the carboxyl resin of Synthesis Example 3.

The reactions in Synthesis Example 1 were similarly performed, using acrylic acid (14.4 parts) in place of acetic acid (8.4 parts), and a solution with a nonvolatile content of 51% was obtained. This solution was a mixture of a carboxyl resin and acrylic acid, with an acid value of 92 mgKOH/g and epoxy-equivalent weight of 6428 g/eq. This solution is hereinafter referred to as "A-3." An IR spectrum and gel chromatogram of the obtained mixture of the carboxyl resin and acrylic acid are shown in FIGS. 6 and 7, respectively.

Synthesis Example 4

Figure 8:
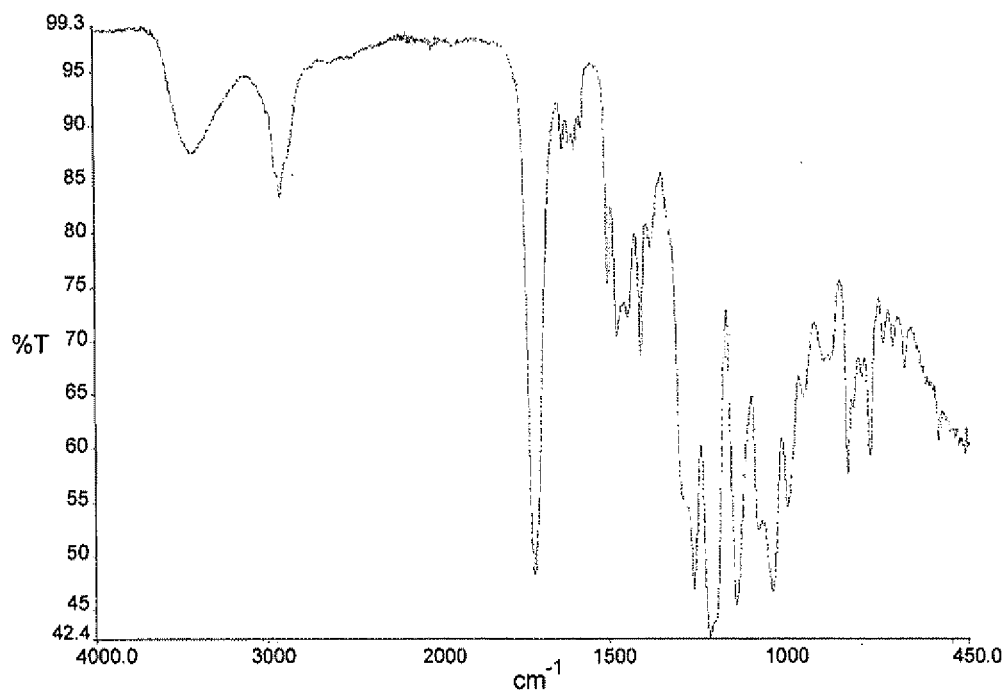
FIG. 8 is an infrared absorption spectrum of a carboxyl resin of Synthesis Example 4.
Figure 9:
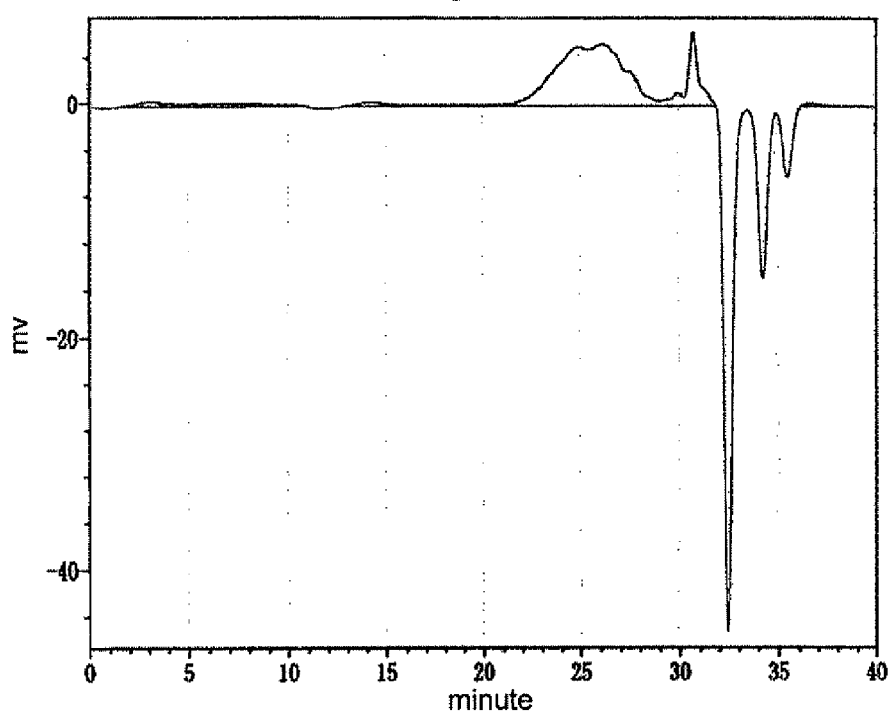
FIG. 9 is a chromatogram obtained by a gel permeation chromatography of the carboxyl resin of Synthesis Example 4.

The reactions in Synthesis Example 3 were similarly performed, using phthalic acid (66.4 parts) in place of maleic acid (46.4 parts), and a solution with a nonvolatile content of 52% was obtained. This solution was a mixture of a carboxyl resin and acrylic acid, with an acid value of 91 mgKOH/g and epoxy-equivalent weight of 6560 g/eq. This solution is hereinafter referred to as "A-4." An IR spectrum and gel chromatogram of the obtained mixture of the carboxyl resin and acrylic acid are shown in FIGS. 8 and 9, respectively.

Synthesis Example 5

Figure 10:
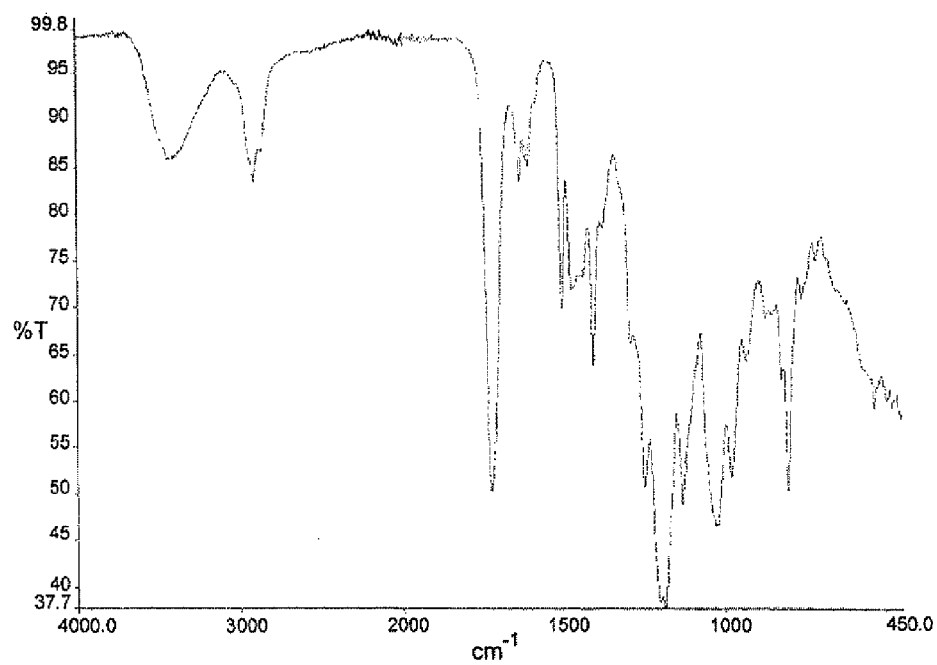
FIG. 10 is an infrared absorption spectrum of a carboxyl resin of Synthesis Example 5.
Figure 11:
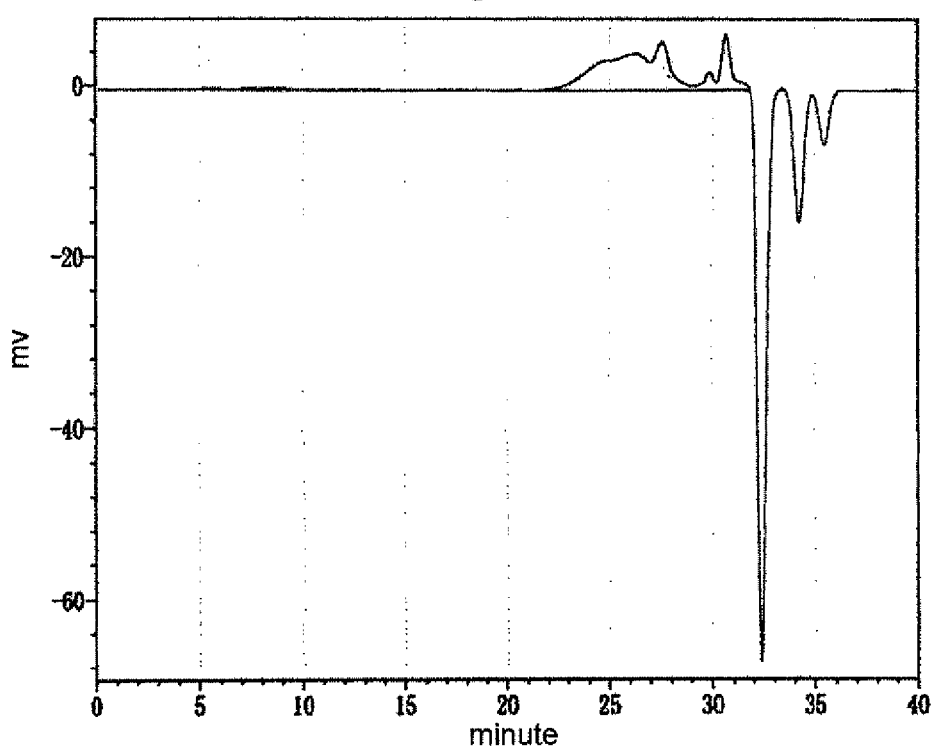
FIG. 11 is a chromatogram obtained by a gel permeation chromatography of the carboxyl resin of Synthesis Example 5.

A cresol novolac-type epoxy resin YDCN-700-5 (manufactured by Tohto Kasei Co., Ltd.; epoxy equivalent weight: 203) (162.2 parts) and bisphenol A-type epoxy resin EPICOAT 828 (manufactured by Japan Epoxy Resins Co., Ltd.; epoxy-equivalent weight: 186) (37.2 parts) were put in a reaction container having a thermometer, stirrer, reflux condenser and air-blowing tube, to which diethylene glycol monoethyl ether acetate (289 parts) was added, and the mixture was dissolved by heat. Next, acrylic acid (36 parts), methyl hydroquinone (0.2 parts) and triphenylphosphine (3 parts) were added, and the mixture was subjected to a 3-hour reaction at 95-105 degrees Celsius, with air continuously blown into it. Subsequently, maleic acid (46.4 parts) and methyl hydroquinone (0.3 parts) were added, and the mixture was subjected to a 2-hour reaction at 95-105 degrees Celsius, followed by the addition of acrylic acid (14.4 parts) and a 4-hour reaction at 95-105 degrees Celsius. As a result, a solution with a nonvolatile content of 51% was obtained. The obtained solution was a mixture of two kinds of carboxyl resins and acrylic acid, with an acid value of 100 mgKOH/g and epoxy-equivalent weight of 7099 g/eq. This solution is hereinafter referred to as "A-5." An IR spectrum and gel chromatogram of the obtained mixture of the two kinds of carboxyl resins and acrylic acid are shown in FIGS. 10 and 11, respectively.

Synthesis Example 6

Figure 12:
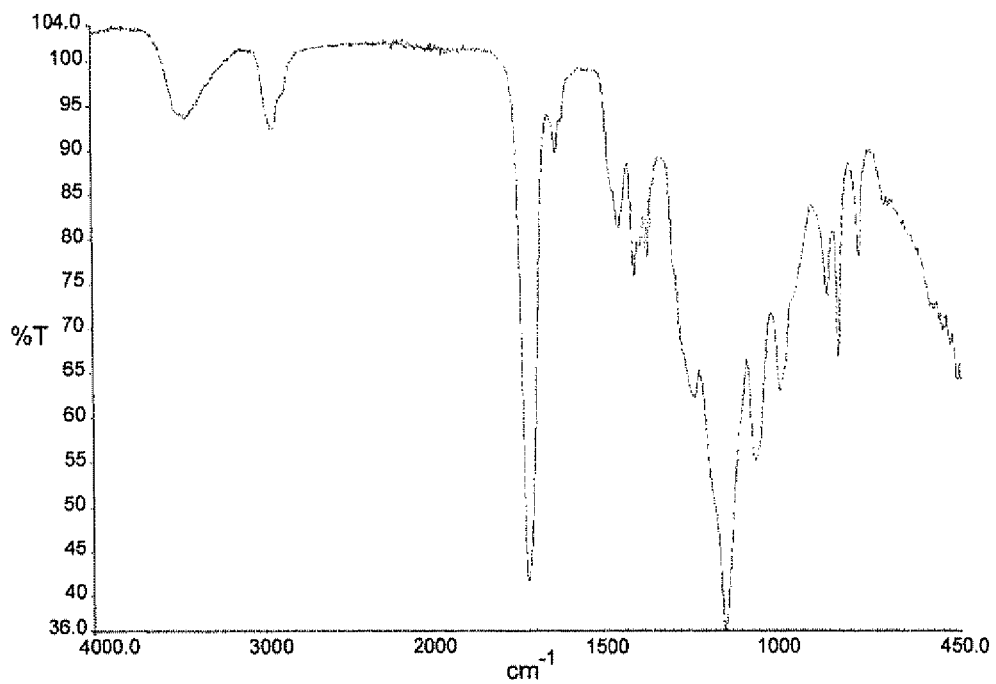
FIG. 12 is an infrared absorption spectrum of a carboxyl resin of Synthesis Example 6.
Figure 13:
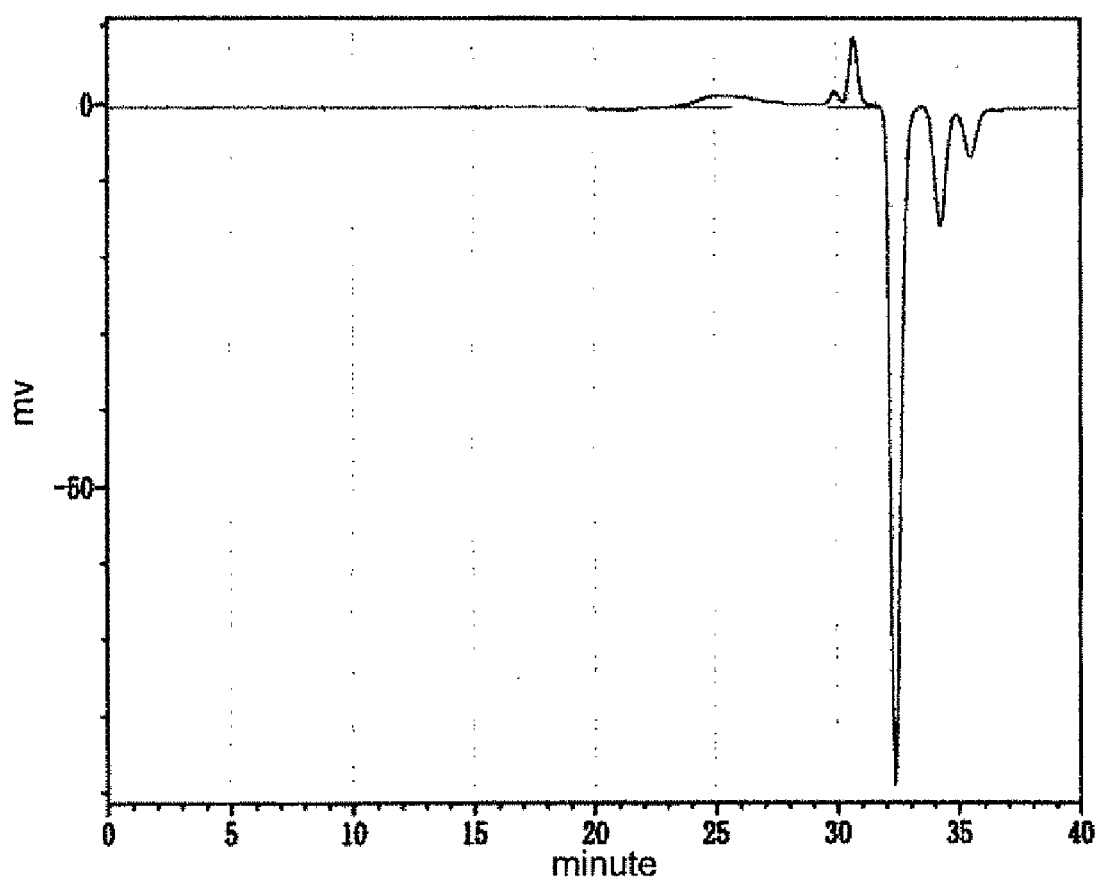
FIG. 13 is a chromatogram obtained by a gel permeation chromatography of the carboxyl resin of Synthesis Example 6.

A solution of copolymer of glycidyl methacrylate, methyl methacrylate, t-butyl acrylate, 2-ethylhexyl methacrylate and t-butyl methacrylate (diethylene glycol monoethyl ether acetate, with a nonvolatile content of 50%, weight-average molecular weight of 5836, and epoxy-equivalent weight of the solid content: 214 g/eq.) (428 parts), acrylic acid (43.2 parts), methyl hydroquinone (0.2 parts), and triphenylphosphine (0.5 parts) were put in a reaction container having a thermometer, stirrer, reflux condenser and air-blowing tube, and the mixture was subjected to a 4-hour reaction at 95-105 degrees Celsius, with air continuously blown into it. Subsequently, diethylene glycol monoethyl ether acetate (237 parts), maleic acid (40.6 parts) and methyl hydroquinone (0.2 parts) were added, and the mixture was subjected to a 0.5-hour reaction at 75-85 degrees Celsius, followed by the addition of acetic acid (6 parts) and a 3-hour reaction at 80-90 degrees Celsius. As a result, a solution with a nonvolatile content of 40% was obtained. This solution was a mixture of a carboxyl resin and acetic acid, with an acid value of 82 mgKOH/g and epoxy-equivalent weight of 5401 g/eq. This solution is hereinafter referred to as "A-6." An IR spectrum and gel chromatogram of the obtained mixture of the carboxyl resin and acetic acid are shown in FIGS. 12 and 13, respectively.

Comparative Synthesis Example 1

A cresol novolac-type epoxy resin YDCN-700-5 (manufactured by Tohto Kasei Co., Ltd.; epoxy equivalent weight:

203) (203 parts) was put in a reaction container having a thermometer, stirrer, reflux condenser and air-blowing tube, to which diethylene glycol monoethyl ether acetate (281 parts) was added, and the mixture was dissolved by heat. Next, acrylic acid (43.2 parts), methyl hydroquinone (0.2 parts) and triphenylphosphine (3 parts) were added, and the mixture was subjected to a 3-hour reaction at 95-105 degrees Celsius, with air continuously blown into it. Subsequently, maleic acid (34.8 parts) and methyl hydroquinone (0.3 parts) were added, and the mixture was subjected to a 6-hour reaction at 95-105 degrees Celsius. As a result, the mixture turned into a gel, which was insoluble in diethylene glycol monoethyl ether acetate. This gel is hereinafter referred to as "B-1."

Comparative Synthesis Example 2

A cresol novolac-type epoxy resin YDCN-700-5 (manufactured by Tohto Kasei Co., Ltd.; epoxy equivalent weight: 203) (203 parts) was put in a reaction container having a thermometer, stirrer, reflux condenser and air-blowing tube, to which diethylene glycol monoethyl ether acetate (305 parts) was added, and the mixture was dissolved by heat. Next, acrylic acid (43.2 parts), methyl hydroquinone (0.2 parts) and triphenylphosphine (3 parts) were added, and the mixture was subjected to a 3-hour reaction at 95-105 degrees Celsius, with air continuously blown into it. Subsequently, adipic acid (58.4 parts) and methyl hydroquinone (0.3 parts) were added, and the mixture was subjected to a 6-hour reaction at 95-105 degrees Celsius. As a result, a solution with a nonvolatile content of 50% was obtained. The obtained carboxyl resin had an acid value of 106 mgKOH/g and epoxy-equivalent weight of 1510 g/eq. This solution is hereinafter referred to as "B-2."

Comparative Synthesis Example 3

A cresol novolac-type epoxy resin EPICLON-695 (manufactured by DIC Corporation; epoxy-equivalent weight: 220) (220 parts) was put in a reaction container having a thermometer, stirrer, reflux condenser and air-blowing tube, to which diethylene glycol monoethyl ether acetate (220 parts) was added, and the mixture was dissolved by heat. Next, methyl hydroquinone (0.46 parts) and triphenylphosphine (3.0 parts) were added. The mixture was heated to 95-105 degrees Celsius and subjected to a 4-hour reaction, with acrylic acid (72 parts) gradually dropped into it and air continuously blown into it. The reaction product was cooled to 80-90 degrees Celsius, after which tetrahydrophthalic acid anhydride (106 parts) was added, and the mixture was subjected to a 5-hour reaction. As a result, a solution with a nonvolatile content of 65% was obtained. The obtained carboxyl resin had an acid value of 100 mgKOH/g. This solution is hereinafter referred to as "B-3."

Comparative Synthesis Example 4

1,5-dihydroxynaphthalene (phenolic hydroxyl group equivalent weight: 80 g/eq.) (224 parts) and bisphenol A-type epoxy resin (EPICOAT 828, manufactured by Japan Epoxy Resin Co., Ltd., epoxy-equivalent weight: 189 g/eq.) (1075 parts) were pre-reacted in a reaction container having a gas-injection tube, stirrer, cooling tube, thermometer, and funnel for continuously dropping an alkaline metal hydroxide solution. The mixture was stirred at 110 degrees Celsius under nitrogen atmosphere to dissolve it. Subsequently, triphenylphosphine (0.65 parts) was added, and the temperature in the reaction container was increased to 150 degrees Celsius. With the temperature maintained at 150 degrees Celsius, the mixture was subjected to reaction for approximately 90 minutes. Thus, an epoxy resin (a) having an epoxy-equivalent weight of 452 g/eq. was obtained. Next, the temperature in the flask was lowered to 40 degrees Celsius, after which epichlorohydrin (1920 parts), toluene (1690 parts) and tetramethylammonium bromide (70 parts) were added, and the mixture was heated to and maintained at 45 degrees Celsius while being stirred. Subsequently, a 48 wt % aqueous solution of sodium hydroxide (364 parts) was continuously dropped into the mixture for 60 minutes, and the mixture was further subjected to a 6-hour reaction. After the reaction was completed, most of the excessive epichlorohydrin and toluene was collected by vacuum distillation, after which the reaction product containing a by-product salt and toluene was dissolved in methyl isobutyl ketone and then washed with water. After an organic solvent layer was separated from water layer, methyl isobutyl ketone was removed from the organic solvent layer by vacuum distillation. Thus, a polynuclear epoxy resin (b) having an epoxy-equivalent weight of 277 g/eq. was obtained. A calculation based on the epoxy-equivalent weight shows that approximately 1.59 alcoholic hydroxide groups out of 1.98 alcoholic hydroxide groups on the epoxy resin (a) was epoxidized in the obtained polynuclear epoxy resin (b). Accordingly, the rate of epoxidation of the alcoholic hydroxide groups was approximately 80%. Next, the polynuclear epoxy resin (b) (277 parts) was put in a flask having a stirrer, cooling tube and thermometer, after which propylene glycol monomethyl ether acetate (290 parts) was added, and the mixture was dissolved by heat. Then, methyl hydroquinone (0.46 parts) and triphenylphosphine (1.38 parts) were added. The mixture was heated to 95-105 degrees Celsius and subjected to a 4-hour reaction, with acrylic acid (72 parts) gradually dropped into it and air continuously blown into it. The reaction product was cooled to 80-90 degrees Celsius, after which tetrahydrophthalic acid anhydride (129 parts) was added, and the mixture was subjected to a 5-hour reaction. As a result, a solution with a nonvolatile content of 62% was obtained. The obtained carboxyl resin had an acid value of 100 mgKOH/g. This solution is hereinafter referred to as "B-4."

Comparative Synthesis Example 5

A novolac-type cresol resin (trade name "Shonol CRG951", manufactured by Showa Highpolymer Co. Ltd., phenolic hydroxyl group equivalent weight: 119.4 g/eq.) (119.4 parts), potassium hydroxide (1.19 parts) and toluene (119.4 parts) were pre-reacted in an autoclave having a thermometer, injector for nitrogen and alkylene oxide, and stirrer. While being stirred, the gas inside the system was replaced with nitrogen and heated to higher temperatures. Next, propylene oxide (63.8 parts) was gradually dropped in the mixture, which was then subjected to a 16-hour reaction at temperatures of 125-132 degrees Celsius under a pressure of 0-4.8 kg/cm². Subsequently, the system was cooled to room temperature, and 89% phosphoric acid (1.56 parts) was added and mixed to neutralize potassium hydroxide. Thus, a propylene oxide reaction solution of the novolac-type cresol resin with a nonvolatile content of 62.1% and alcoholic hydroxyl group equivalent weight of 182.2 g/eq. was obtained. This solution had approximately 1.08 mol of alkylene oxide added thereto per one phenolic hydroxyl group equivalent weight. The obtained propylene oxide reaction solution of the novolac-type cresol resin (293.0 parts), acrylic acid (43.2 parts), methansulfonic acid (11.53 parts), methyl hydroquinone (0.18 parts) and toluene (252.9 parts) were pre-reacted in a reaction container having a stirrer, thermometer and air-blowing tube. While being stirred, this mixture was subjected to a 12-hour reaction at 110 degrees Celsius, with air continuously blown into it at a rate of 10 ml/sec. This reaction produced 12.6 parts of water, which was distilled as an azeotropic mixture with toluene. Subsequently, the solution was cooled to room temperature, and the obtained reaction solution was neutralized with 15% aqueous solution of sodium hydroxide (35.35 parts) and then washed with water. After that, toluene was replaced with propylene glycol monomethyl ether acetate (149 parts) and distilled away by an evaporator. Thus, a novolac-type acrylate resin solution was obtained. Next, the obtained novolac-type acrylate resin solution (332.5 parts) and triphenylphosphine (1.22 parts) were pre-reacted in a reactor having a stirrer, thermometer and air-blowing tube. Then, with this mixture being stirred and air being continuously blown into it, tetrahydrophthalic acid anhydride (60.8 parts) was gradually added to the mixture, which was subjected to a 6-hour reaction at 95-101 degrees Celsius. As a result, a solution with a nonvolatile content of 65% was obtained. The obtained carboxyl resin had an acid value of 84 mgKOH/g. This solution is hereinafter referred to as "B-5."

Evaluation of Resins (1) Development Property

By means of a bar coater, each of the solutions obtained in Synthesis Examples 1-6 and Comparative Synthesis Examples 2-5 was applied, with a thickness of 30-40 μm, on the entire surface of a printed-wiring board with copper plated through-hole having a pre-formed pattern, and the applied layer was dried in a circulating hot air drying oven at 80 degrees Celsius for 20 minutes. Subsequently, the pattern image was developed with a 1% aqueous solution of sodium carbonate for 20 seconds under a spray pressure of 2.0 kg/cm$^2$, and the state of the developed image was visually determined. The sample that gelated (Comparative Synthesis Example 1) was excluded from this test. The result is shown in Table 1 using the following symbols:

TABLE 1

| Property | Synthesis Examples | | | | | | Comparative Synthesis Examples | | | | |
|---|---|---|---|---|---|---|---|---|---|---|---|
| | A-1 | A-2 | A-3 | A-4 | A-5 | A-6 | B-1 | B-2 | B-3 | B-4 | B-5 |
| (1) Development Property | ○ | ○ | ○ | ○ | ○ | ○ | — | X | X | X | X |

○: Coating film removed completely.
X: Undeveloped portions remained.

Preparation of Hardening Compositions

Using the solutions obtained in Synthesis Examples 1-6 and Comparative Synthesis Examples 2-5, hardening compositions were prepared by mixing components with the composition ratios shown in Table 2 (the figures are expressed in parts by mass) and kneading each of the obtained mixtures with a triple roll mill. The obtained hardening compositions are referred to as Composition Examples 1-6 and Comparative Composition Examples 1-5. In Table 2, IRGACURE-907 is a photo-polymerization initiator and DPHA is a photosensitive acrylate compound.

TABLE 2

| Components (parts by mass) | Composition Examples | | | | | | Comparative Composition Examples | | | | |
|---|---|---|---|---|---|---|---|---|---|---|---|
| | 1 | 2 | 3 | 4 | 5 | 6 | 1 | 2 | 3 | 4 | 5 |
| A-1 | 200 | | | | | | | | | | |
| A-2 | | 192 | | | | | | | | | |
| A-3 | | | 196 | | | | | | | | |
| A-4 | | | | 192 | | | | | | | |
| A-5 | | | | | 196 | | | | | | |
| A-6 | | | | | | 250 | | | | | |
| B-1 | | | | | | | — | | | | |
| B-2 | | | | | | | | 200 | | | |
| B-3 | | | | | | | | | 154 | | |
| B-4 | | | | | | | | | | 161 | |
| B-5 | | | | | | | | | | | 154 |
| IRGACURE 907 | 15 | 15 | 15 | 15 | 15 | 15 | — | 15 | 15 | 15 | 15 |
| DPHA | 20 | 20 | 20 | 20 | 20 | 20 | — | 20 | 20 | 20 | 20 |
| EPO TOHTO YDCN704P | 28 | 26 | 28 | 26 | 28 | 23 | — | 38 | 36 | 36 | 30 |
| RE306 | 13 | 12 | 13 | 12 | 13 | 11 | — | 17 | 17 | 17 | 14 |

TABLE 2-continued

| Components | Composition Examples | | | | | | Comparative Composition Examples | | | | |
|---|---|---|---|---|---|---|---|---|---|---|---|
| (parts by mass) | 1 | 2 | 3 | 4 | 5 | 6 | 1 | 2 | 3 | 4 | 5 |
| Melamine | 3 | 3 | 3 | 3 | 3 | 3 | — | 3 | 3 | 3 | 3 |
| Silicon KS66 | 1 | 1 | 1 | 1 | 1 | 1 | — | 1 | 1 | 1 | 1 |

Remarks
IRUGACURE 907: 2-methyl-1-[4-(methylthio)phenyl]-2-morpholinopropane (manufactured by Ciba Specialty Chemicals K.K.)
DPHA: Mixture of dipentaerythritol pentaacrylate and dipentaerythritol hexaacrylate (manufactured by Nippon Kayaku Co., Ltd.)
EPO TOHTO YDCN704P: Novolac-type epoxy resin (manufactured by Tohto Kasei Co., Ltd.)
RE306: Novolac-type epoxy resin (manufactured by Nippon Kayaku Co., Ltd.)
KS66: Silicon-based antifoaming agent (manufactured by Shin-Etsu Chemical Co., Ltd.)

Evaluation of Hardening Compositions

By a screen printing method using a 100-mesh polyester screen, each of the hardening compositions (Composition Examples 1-6 and Comparative Composition Examples 2-5) was applied, with a thickness of 30-40 μm, on the entire surface of a printed-wiring board with copper plated through-hole having a pre-formed pattern, and the applied layer was dried in a circulating hot air drying oven at 80 degrees Celsius for 20 minutes. Then, a negative film having a resist pattern was closely attached to that layer, and ultraviolet light with a light exposure of 1000 mJ/cm$^2$ was cast onto them by an ultraviolet exposure apparatus (HMW-680GW, manufactured by ORC MANUFACTURING CO., LTD.). Next, the pattern image was developed with a 1% aqueous solution of sodium carbonate for 40 seconds under a spray pressure of 2.0 kg/cm$^2$, after which unexposed portions were dissolved away. Subsequently, the layer was subjected to a thermo-setting process in the circulating hot air drying oven at 150 degrees Celsius for 60 minutes. Thus, evaluation boards with hardened films were obtained.

The performances of the obtained boards were evaluated in regard to the following points (2) through (7). The result is shown in Table 3.

TABLE 3

| Properties | Composition Examples | | | | | | Comparative Composition Examples | | | | |
|---|---|---|---|---|---|---|---|---|---|---|---|
| | 1 | 2 | 3 | 4 | 5 | 6 | 1 | 2 | 3 | 4 | 5 |
| (2) Pencil Hardness | 6H | 6H | 6H | 6H | 6H | 6H | — | — | 5H | 4H | 3H |
| (3) Heat Resistance | ○ | ○ | ○ | ○ | ○ | ○ | — | — | ○ | ○ | ○ |
| (4) Acid Resistance | ○ | ○ | ○ | ○ | ○ | ○ | — | — | ○ | ○ | ○ |
| (5) Alkali Resistance | ○ | ○ | ○ | ○ | ○ | ○ | — | — | ○ | ○ | ○ |
| (6) Electrical Insulation | ○ | ○ | ○ | ○ | ○ | ○ | — | — | X | X | ○ |
| (7) Flexibility | ○ | ○ | ○ | ○ | ○ | ○ | — | — | X | Δ | Δ |

(2) Pencil Hardness

A pencil hardness test of each evaluation board was conducted according to JIS K 5400. The sample that gelated (Comparative Composition Example 1) and the sample on which no image could be developed (Comparative Composition Example 2) were excluded from this test.

(3) Heat Resistance

According to the test method of JIS C 6481, each evaluation board was immersed three times in a bath of molten solder of 260 degrees Celsius, and its appearance was evaluated by the following criteria. As the post flux (rosin-based), a flux as specified in JIS C 6481 was used. The sample that gelated (Comparative Composition Example 1) and the sample on which no image could be developed (Comparative Composition Example 2) were excluded from this test.

○: No appearance change.
Δ: Discoloration of hardened film recognized.
X: Lifting or peeling of hardened film, and/or solder penetration occurred.

(4) Acid Resistance

Each evaluation board was immersed in a 10% by volume of sulfuric acid solution at 20 degrees Celsius and then taken out after 30 minutes to generally determine and evaluate the state and adhesion of the hardened film. The determination criteria were as follows. The sample that gelated (Comparative Composition Example 1) and the sample on which no image could be developed (Comparative Composition Example 2) were excluded from this test.

○: No change recognized.
Δ: Slight change recognized.
X: Blistering or swelling-and-dropping of applied film recognized.

(5) Alkali Resistance

An alkali resistance test of the evaluation boards was conducted in the same manner as the acid resistance test except for the use of a 10% by volume of sodium hydroxide solution in place of the 10% by volume of sulfuric acid solution. The sample that gelated (Comparative Composition Example 1) and the sample on which no image could be developed (Comparative Composition Example 2) were excluded from this test.

(6) Electrical Insulation Property

Using a printed circuit board with pattern B (with a thickness of 1.6 mm) specified in IPC in place of the printed-wiring board with copper plated through-hole having a pre-formed pattern, the process of applying and curing the hardening resin composition was carried out in the previously described manner, and the electrical insulation property of the obtained hardened films was evaluated by the following criteria. The sample that gelated (Comparative Composition Example 1) and the sample on which no image could be developed (Comparative Composition Example 2) were excluded from this test.

Moistening condition: temperature, 121 degrees Celsius; Humidity, 86% RH; applied voltage, 5 V; and 100 hours Measurement condition: measurement time, 60 seconds; and applied voltage, 500 V ○: Insulation resistance equal to or higher than $10^9 \Omega$; no migration of copper.
Δ: Insulation resistance equal to or higher than $10^9 \Omega$; migration of copper found.
X: Insulation resistance equal to or lower than $10^8 \Omega$; migration of copper found.

(7) Flexibility

Using a polyester film in place of the printed-wiring board with copper plated through-hole having a pre-formed pattern, the process of applying and curing a hardening resin composition was carried out in the previously described manner, after which the hardened film was removed from the polyester film to obtain an evaluation film of 5 cm in length and 2 cm in width. The obtained film was folded and its state was evaluated by the following criteria. The sample that gelated and the sample on which no image could be developed were excluded from this test.

◯: The film did not crack even when folded by 170 degrees.

Δ: The film did not crack when folded by 160 degrees, but cracked when folded by 170 degrees.

X: The film cracked when folded by 160 degrees.

EXAMPLE 2

Preparation of Hardening Compositions

In Example 2, the solutions A-1 through A-6 (Synthesis Example 1-6) and the solutions B-3 through B-5 (Comparative Synthesis Example 3-5) used in Example 1 were each mixed with the components shown in Table 4 with the composition ratios shown in Table 4 (the figures are expressed in parts by mass), and the obtained mixtures were individually kneaded with a triple roll mill to obtain hardening compositions. The obtained hardening compositions are referred to as Composition Examples 7-12 and Comparative Composition Examples 6-8.

dryer at 80 degrees Celsius for 20 minutes. Subsequently, the pattern image was developed with a 1 wt% aqueous solution of sodium carbonate for 20 seconds under a spray pressure of 2.0 kg/cm². The state of the developed image was visually determined. The determination result is shown in Table 5 using the following symbols:

TABLE 5

| Property | Composition Examples | | | | | | Comparative Composition Examples | | |
|---|---|---|---|---|---|---|---|---|---|
| | 7 | 8 | 9 | 10 | 11 | 12 | 6 | 7 | 8 |
| (1) Development Property | ◯ | ◯ | ◯ | ◯ | ◯ | ◯ | X | X | X |

By a screen printing method using a 100-mesh polyester screen, each of the hardening compositions of Composition Examples 7-12 and Comparative Composition Examples 6-8 was applied, with a thickness of 50-60 μm, on the entire surface of a printed-wiring board with copper plated through-hole having a pre-formed pattern, and the applied layer was dried in a circulating hot air drying oven at 80 degrees Celsius for 30 minutes. Then, a negative film having a resist pattern was closely attached to that layer, and ultraviolet light with a light exposure of 600 mJ/cm² was cast onto them by an ultraviolet exposure apparatus (HMW-680GW, manufactured by ORC MANUFACTURING CO., LTD.). Next, the pattern image was developed with a 1% aqueous solution of

TABLE 4

| Components | Composition Examples | | | | | | Comparative Composition Examples | | |
|---|---|---|---|---|---|---|---|---|---|
| (parts by mass) | 7 | 8 | 9 | 10 | 11 | 12 | 6 | 7 | 8 |
| A-1 | 200 | | | | | | | | |
| A-2 | | 192 | | | | | | | |
| A-3 | | | 196 | | | | | | |
| A-4 | | | | 192 | | | | | |
| A-5 | | | | | 196 | | | | |
| A-6 | | | | | | 250 | | | |
| B-3 | | | | | | | 154 | | |
| B-4 | | | | | | | | 161 | |
| B-5 | | | | | | | | | 154 |
| IRGACURE 907 | 15 | 15 | 15 | 15 | 15 | 15 | 15 | 15 | 15 |
| DPHA | 20 | 20 | 20 | 20 | 20 | 20 | 20 | 20 | 20 |
| phthalocyanine blue | 1 | 1 | 1 | 1 | 1 | 1 | 1 | 1 | 1 |
| barium sulfate | 50 | 50 | 50 | 50 | 50 | 50 | 50 | 50 | 50 |
| melamine | 3 | 3 | 3 | 3 | 3 | 3 | 3 | 3 | 3 |
| EPO TOHTO YDCN704P | 28 | 26 | 28 | 26 | 28 | 23 | 36 | 36 | 30 |
| RE306 | 13 | 12 | 13 | 12 | 13 | 11 | 17 | 17 | 14 |
| BYK-410 | 3 | 3 | 3 | 3 | 3 | 3 | 3 | 3 | 3 |
| Silicon KS66 | 3 | 3 | 3 | 3 | 3 | 3 | 3 | 3 | 3 |

Remarks
IRUGACURE 907: 2-methyl-1-[4-(methylthio)phenyl]-2-morpholinopropane (manufactured by Ciba Specialty Chemicals K.K.)
DPHA: Mixture of dipentaerythritol pentaacrylate and dipentaerythritol hexaacrylate (manufactured by Nippon Kayaku Co., Ltd.)
EPO TOHTO YDCN704P: Novolac-type epoxy resin (manufactured by Tohto Kasei Co., Ltd.)
RE306: Novolac-type epoxy resin (manufactured by Nippon Kayaku Co., Ltd.)
BYK410: Sagging Prevention Agent (manufactured by BYK Japan KK)
KS66: Silicon-based antifoaming agent (manufactured by Shin-Etsu Chemical Co., Ltd.)

Evaluation of Hardening Compositions
(1) Development Property

By a screen printing method using a 100-mesh polyester screen, each of the hardening compositions was applied, with a thickness of 30-40 μm, on the entire surface of a printed-wiring board with copper plated through-hole having a pre-formed pattern, and the applied layer was dried with a hot air sodium carbonate for 60 seconds under a spray pressure of 2.0 kg/cm², after which unexposed portions were dissolved away. Subsequently, the layer was subjected to a thermo-setting process in the circulating hot air drying oven at 150 degrees Celsius for 60 minutes. Thus, evaluation boards with hardened films were obtained. The performances of the obtained boards were evaluated in regard to the following points: (2)

pencil hardness, (3) heat resistance, (4) acid resistance, (5) alkali resistance, (6) adhesion property, (7) PCT resistance, (8) electroless gold plating resistance, (9) whitening resistance, (10) electrical insulation property, and (11) flexibility. The result is shown in Table 6.

TABLE 6

| Property | Composition Examples | | | | | | Comparative Composition Examples | | |
|---|---|---|---|---|---|---|---|---|---|
| | 7 | 8 | 9 | 10 | 11 | 12 | 6 | 7 | 8 |
| (2) Pencil Hardness | 6H | 6H | 6H | 6H | 6H | 6H | 5H | 4H | 3H |
| (3) Heat Resistance | ○ | ○ | ○ | ○ | ○ | ○ | ○ | ○ | ○ |
| (4) Acid Resistance | ○ | ○ | ○ | ○ | ○ | ○ | ○ | ○ | ○ |
| (5) Alkali Resistance | ○ | ○ | ○ | ○ | ○ | ○ | ○ | ○ | ○ |
| (6) Adhesion Property | ○ | ○ | ○ | ○ | ○ | ○ | X | Δ | ○ |
| (7) PCT Resistance | ○ | ○ | ○ | ○ | ○ | ○ | X | X | Δ |
| (8) Electroless Gold Plating Resistance | ○ | ○ | ○ | ○ | ○ | ○ | X | Δ | Δ |
| (9) Whitening Resistance | ○ | ○ | ○ | ○ | ○ | ○ | Δ | Δ | X |
| (10) Electrical Insulation | ○ | ○ | ○ | ○ | ○ | ○ | X | X | ○ |
| (11) Flexibility | ○ | ○ | ○ | ○ | ○ | ○ | X | Δ | Δ |

○: Coating film removed completely.
X: Undeveloped portions remained.

The evaluation methods for these performances are as follows. It should be noted that the performance evaluation methods for (2) pencil hardness, (3) solder heat resistance, (4) acid resistance, (5) alkali resistance, (10) electrical insulation property and (11) flexibility are the same as in Example 1, hence explanation of these performances will be omitted.

(6) Adhesion Property

According to the testing method of JIS D 0202, grid-like cross cuts were formed on each evaluation board, and a pealing test using an adhesive cellophane tape was performed. Then, the peeled state of each board was visually determined by the following criteria.

○: 100/100
Δ: 50/100 to 90/100
X: 0/100 to 50/100

(7) PCT Resistance

The PCT resistance of the hardened film formed on each evaluation board was evaluated by the following criteria after the boards were kept in saturated water vapor at 121 degrees Celsius for 50 hours.

○: Neither blistering, peeling nor discoloration of the hardened film recognized.
Δ: Slight blistering, peeling or discoloration of the hardened film recognized.
X: Blistering, peeling or discoloration of the hardened film recognized.

(8) Electroless Gold Plating Resistance

The evaluation boards were subjected to an electroless nickel plating process and then an electroless gold plating process, and then their appearance change was visually determined. A pealing test using an adhesive cellophane tape was also performed, and the peeled state of each board was determined. The criteria are as follows.

○: No appearance change, and no peeling of the hardened film.
Δ: No appearance change, but slight peeling of the hardened film found.
X: Lifting of the hardened film found, plating metal penetration recognized, and significant peeling of the hardened film occurred in the peeling test, (9) Whitening Resistance The evaluation boards were immersed in hot water of 60 degrees Celsius for 10 minutes, after which they were taken out and naturally cooled to room temperature. Then, the surface conditions of the hardened films on the evaluation boards were evaluated by the following criteria.

○: No appearance change.
Δ: Slightly whitened, cloudy appearance.
X: Whitened, cloudy appearance.

EXAMPLE 3

Synthesis of Carboxyl Resins

In Example 3, in addition to Synthesis Examples 1-6 shown in Example 1, three solutions A7 through A9 containing carboxyl resins were prepared according to the following Synthesis Examples 7-9.

Synthesis Example 7

A bisphenol A-type Epoxy resin EPICOAT 1001 (manufactured by Japan Epoxy Resins Co., Ltd.; epoxy-equivalent weight 483) (483 parts) was put in a reaction container having a thermometer, stirrer, reflux condenser and air-blowing tube, to which diethylene glycol monoethyl ether acetate (238 parts) was added, and the mixture was dissolved by heat. Next, acrylic acid (72 parts), methyl hydroquinone (0.2 parts) and triphenylphosphine (3 parts) were added, and the mixture was subjected to a 6-hour reaction at 95-105 degrees Celsius, with air continuously blown into it. Subsequently, tetrahydrophthalic acid anhydride (107 parts) and methyl hydroquinone (0.3 parts) were added, and the mixture was subjected to a 7-hour reaction at 90-100 degrees Celsius, followed by the addition of diethylene glycol monoethyl ether acetate (424 parts). As a result, a solution with a nonvolatile content of 50% was ontained. The obtained carboxyl resin solution had an acid value of 60 mgKOH/g. This solution is hereinafter referred to as "A-7."

Synthesis Example 8

A solution of copolymer of glycidyl methacrylate, methyl methacrylate, t-butyl acrylate, 2-ethylhexyl methacrylate and t-butyl methacrylate (diethylene glycol monoethyl ether acetate, with a nonvolatile content of 50%, weight-average molecular weight of 5836, and epoxy-equivalent weight of solid content: 214 g/eq.) (428 parts), acrylic acid (72 parts), methyl hydroquinone (0.2 parts), and triphenylphosphine (1 parts) were put in a reaction container having a thermometer, stirrer, reflux condenser and air-blowing tube, and the mixture was subjected to an 8-hour reaction at 95-105 degrees Celsius, with air continuously blown into it. Subsequently, tetrahydrophthalic acid anhydride (55 parts) and methyl hydroquinone (0.2 parts) were added, and the mixture was subjected to a 9-hour reaction at 95-105 degrees Celsius, followed by the addition of diethylene glycol monoethyl ether acetate (127 parts). As a result, a solution with a nonvolatile content of 50% was obtained. The obtained solution of a carboxyl resin had an acid value of 60 mgKOH/g. This solution is hereinafter referred to as "A-8."

Synthesis Example 9

A cresol novolac-type epoxy resin EPICLON-695 (manufactured by DIC Corporation, epoxy equivalent weight: 220) (220 parts) was put in a reaction container having a thermometer, stirrer, reflux condenser and air-blowing tube, to which diethylene glycol monoethyl ether acetate (220 parts) was added, and the mixture was dissolved by heat. Next, methyl hydroquinone (0.46 parts) and triphenylphosphine (3.0 parts) were added. The mixture was heated to 95-105 degrees Celsius and subjected to a 4-hour reaction, with acrylic acid (72 parts) gradually dropped into it and air continuously blown into it. The reaction product was cooled to 80-90 degrees Celsius, after which tetrahydrophthalic acid anhydride (106 parts) was added, and the mixture was subjected to a 5-hour reaction. As a result, a solution with a nonvolatile content of 65% was obtained. The obtained carboxyl resin had an acid value of 100 mgKOH/g. This solution is hereinafter referred to as "A-9."

Preparation of Hardening Compositions

Next, the solutions A-1 through A-6 (Synthesis Example 1-6) and the aforementioned solutions A-7 through A-9 were each mixed with the components shown in Table 7 with the composition ratios shown in Table 7 (the figures are expressed in parts by mass), and the obtained mixtures were individually kneaded with a triple roll mill to obtain hardening compositions. The obtained hardening compositions are referred to as Composition Examples 13-18 and Comparative Composition Examples 9-13.

Evaluation of Hardening Compositions (1) Development Property

By a screen printing method using a 100-mesh polyester screen, each of the hardening compositions was applied, with a thickness of 30-40 um, on the entire surface of a printed-wiring board with copper plated through-hole having a pre-formed pattern, and the applied layer was dried with a hot air dryer at 80 degrees Celsius for 20 minutes. Subsequently, the pattern image was developed with a 1 wt % aqueous solution of sodium carbonate for 20 seconds under a spray pressure of 2.0 kg/cm$^2$. The state of the developed image was visually determined. The determination result is shown in Table 8, where the meanings of the symbols are as follows:

TABLE 8

| Property | Composition Examples | | | | | | Comparative Composition Examples | | | | |
|---|---|---|---|---|---|---|---|---|---|---|---|
| | 13 | 14 | 15 | 16 | 17 | 18 | 9 | 10 | 11 | 12 | 13 |
| (1) Development Property | ○ | ○ | ○ | ○ | ○ | ○ | X | X | X | X | X |

○: Coating film removed completely.
X: Undeveloped portions remained.

By a screen printing method using a 100-mesh polyester screen, each of the hardening compositions of Composition Examples 13-18 and Comparative Composition Examples 9-13 was applied, with a thickness of 50-60 μm, on the entire surface of a printed-wiring board with copper plated through-hole having a pre-formed pattern, and the applied layer was

TABLE 7

| Components | Composition Examples | | | | | | Comparative Composition Examples | | | | |
|---|---|---|---|---|---|---|---|---|---|---|---|
| (parts by mass) | 13 | 14 | 15 | 16 | 17 | 18 | 9 | 10 | 11 | 12 | 13 |
| A-1 | 120 | | | | | | | | | | |
| A-2 | | 115 | | | | | | | | | |
| A-3 | | | 118 | | | | | | | | |
| A-4 | | | | 115 | | | | | | | |
| A-5 | | | | | 118 | | | | | | |
| A-6 | | | | | | 150 | | | | | |
| A-7 | 80 | 80 | 80 | 80 | | | 200 | | | 80 | |
| A-8 | | | | | 80 | 80 | | 200 | | | 80 |
| A-9 | | | | | | | | | 154 | 93 | 93 |
| IRGACURE 907 | 15 | 15 | 15 | 15 | 15 | 15 | 15 | 15 | 15 | 15 | 15 |
| DPHA | 20 | 20 | 20 | 20 | 20 | 20 | 20 | 20 | 20 | 20 | 20 |
| phthalocyanine blue | 1 | 1 | 1 | 1 | 1 | 1 | 1 | 1 | 1 | 1 | 1 |
| barium sulfate | 50 | 50 | 50 | 50 | 50 | 50 | 50 | 50 | 50 | 50 | 50 |
| melamine | 3 | 3 | 3 | 3 | 3 | 3 | 3 | 3 | 3 | 3 | 3 |
| EPO TOHTO YDCN704P | 25 | 24 | 25 | 24 | 25 | 23 | 22 | 22 | 36 | 30 | 30 |
| RE306 | 12 | 12 | 12 | 12 | 12 | 11 | 10 | 10 | 17 | 14 | 14 |
| BYK-410 | 3 | 3 | 3 | 3 | 3 | 3 | 3 | 3 | 3 | 3 | 3 |
| Silicon KS66 | 3 | 3 | 3 | 3 | 3 | 3 | 3 | 3 | 3 | 3 | 3 |

Remarks
IRUGACURE 907: 2-methyl-1-[4-(methylthio)phenyl]-2-morpholinopropane (manufactured by Ciba Specialty Chemicals K.K.)
DPHA: Mixture of dipentaerythritol pentaacrylate and dipentaerythritol hexaacrylate (manufactured by Nippon Kayaku Co., Ltd.)
EPO TOHTO YDCN704P: Novolac-type epoxy resin (manufactured by Tohto Kasei Co., Ltd.)
RE306: Novolac-type epoxy resin (manufactured by Nippon Kayaku Co., Ltd.)
BYK410: Sagging Prevention Agent (manufactured by BYK Japan KK)
KS66: Silicon-based antifoaming agent (manufactured by Shin-Etsu Chemical Co., Ltd.)

dried in a circulating hot air drying oven at 80 degrees Celsius for 30 minutes. Then, a negative film having a resist pattern was closely attached to that layer, and ultraviolet light with a light exposure of 600 mJ/cm$^2$ was cast onto them by an ultraviolet exposure apparatus (HMW-680GW, manufactured by ORC MANUFACTURING CO., LTD.). Next, the pattern image was developed with a 1% aqueous solution of sodium carbonate for 60 seconds under a spray pressure of 2.0 kg/cm$^2$, after which unexposed portions were dissolved away. Subsequently, the layer was subjected to a thermo-setting process in the circulating hot air drying oven at 150 degrees Celsius for 60 minutes. Thus, evaluation boards with hardened films were obtained. The performances of the obtained boards were evaluated in regard to the following points: (2) pencil hardness, (3) solder heat resistance, (4) acid resistance, (5) alkali resistance, (6) adhesion property, (7) PCT resistance, (8) electroless gold plating resistance, (9) whitening resistance, (10) electrical insulation property, and (11) flexibility. The result is shown in Table 9. The evaluation methods for these performances are the same as in Examples 1 and 2, hence explanation of these performances will be omitted.

TABLE 9

| Property | Composition Examples | | | | | | Comparative Composition Examples | | | | |
| --- | --- | --- | --- | --- | --- | --- | --- | --- | --- | --- | --- |
|  | 13 | 14 | 15 | 16 | 17 | 18 | 9 | 10 | 11 | 12 | 13 |
| (2) Pencil Hardness | 6H | 6H | 6H | 6H | 6H | 6H | 4H | 4H | 5H | 4H | 4H |
| (3) Heat Resistance | ○ | ○ | ○ | ○ | ○ | ○ | X | Δ | ○ | Δ | ○ |
| (4) Acid Resistance | ○ | ○ | ○ | ○ | ○ | ○ | ○ | ○ | ○ | ○ | ○ |
| (5) Alkali Resistance | ○ | ○ | ○ | ○ | ○ | ○ | ○ | ○ | ○ | ○ | ○ |
| (6) Adhesion Property | ○ | ○ | ○ | ○ | ○ | ○ | Δ | X | X | Δ | X |
| (7) PCT Resistance | ○ | ○ | ○ | ○ | ○ | ○ | X | X | X | X | X |
| (8) Electroless Gold Plating Resistance | ○ | ○ | ○ | ○ | ○ | ○ | X | X | X | X | X |
| (9) Whitening Resistance | ○ | ○ | ○ | ○ | ○ | ○ | X | Δ | Δ | X | Δ |
| (10) Electrical Insulation | ○ | ○ | ○ | ○ | ○ | ○ | Δ | X | X | X | X |
| (11) Flexibility | ○ | ○ | ○ | ○ | ○ | ○ | ○ | X | X | Δ | X |

INDUSTRIAL APPLICABILITY

The carboxyl resins and the hardening compositions according to the present invention do not gelate, have an excellent development property and are capable of forming a hardened film having the previously described excellent properties. Such resins and compositions are useful for various applications, such as solder resists, dry films, etching resists, plating resists, interlayer insulations of multilayer wiring substrates, permanent masks used in the production of tape carrier packages, flexible wiring board resists, color filter resists, ink jet resists, and textile-processing resists.

The invention claimed is:

1. A carboxyl resin having an acid value within a range from 20 to 200 mgKOH/g and being soluble in an organic solvent, the carboxyl resin being obtained by a process including following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight.

2. The carboxyl resin according to claim 1, wherein both the monocarboxylic acids (b) and (f) are a monocarboxylic acid containing an unsaturated group.

3. The carboxyl resin according to claim 1, wherein the monocarboxylic acid (b) is a monocarboxylic acid containing an unsaturated group and the monocarboxylic acid (f) is a monocarboxylic acid that does not contain any unsaturated group.

4. The carboxyl resin according to claim 1, wherein the monocarboxylic acid (b) is a monocarboxylic acid that does not contain any unsaturated group and the monocarboxylic acid (f) is a monocarboxylic acid containing an unsaturated group.

5. The carboxyl resin according to claim 1, wherein both the monocarboxylic acids (b) and (f) are a monocarboxylic acid that does not contain any unsaturated group.

6. The carboxyl resin according to claim 1, wherein the monocarboxylic acid (b) and/or the monocarboxylic acid (f) is either acrylic acid or methacrylic acid.

7. The carboxyl resin according to claim 1, wherein the resin (a) containing two or more epoxy groups in one molecule is a novolac-type epoxy resin.

8. The carboxyl resin according to claim 1, wherein the polybasic acid (d) is a carboxylic acid that is soluble in a reactant solvent and/or soluble in a solvent at a reaction temperature.

9. An alkali developable hardening composition, comprising:
(A) a carboxyl resin having an acid value within a range from 20 to 200 mgKOH/g and being soluble in an organic solvent, the carboxyl resin being obtained by a process including following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight;
(B) a photosensitive (meta)acrylate compound; and
(C) a photo-polymerization initiator.

10. The hardening composition according to claim 9, wherein the hardening composition further contains (D) a carboxyl compound.

11. The hardening composition according to claim 9, wherein both the monocarboxylic acids (b) and (f) are a monocarboxylic acid containing an unsaturated group.

12. The hardening composition according to claim 11, wherein the monocarboxylic acid containing an unsaturated group is either acrylic acid or methacrylic acid.

13. The hardening composition according to claim 9, wherein the monocarboxylic acid (b) is a monocarboxylic acid containing an unsaturated group and the monocarboxylic acid (f) is a monocarboxylic acid that does not contain any unsaturated group.

14. The hardening composition according to claim 13, wherein the monocarboxylic acid containing an unsaturated group is either acrylic acid or methacrylic acid.

15. The hardening composition according to claim 9, wherein the monocarboxylic acid (b) is a monocarboxylic acid that does not contain any unsaturated group and the monocarboxylic acid (f) is a monocarboxylic acid containing an unsaturated group.

16. The hardening composition according to claim 15, wherein the monocarboxylic acid containing an unsaturated group is either acrylic acid or methacrylic acid.

17. The hardening composition according to claim 9, wherein both the monocarboxylic acids (b) and (f) are a monocarboxylic acid that does not contain any unsaturated group.

18. The hardening composition according to claim 9, wherein the resin (a) containing two or more epoxy groups in one molecule is a novolac-type epoxy resin.

19. The hardening composition according to claim 9, wherein the polybasic acid (d) is a carboxylic acid that is soluble in a reactant solvent and/or soluble in a solvent at a reaction temperature.

20. A hardened material of an alkali developable hardening composition containing:
(A) a carboxyl resin having an acid value within a range from 20 to 200 mgKOH/g and being soluble in an organic solvent, the carboxyl resin being obtained by a process including following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight;
(B) a photosensitive (meta)acrylate compound; and
(C) a photo-polymerization initiator.

21. The hardened material according to claim 20, wherein the hardening composition further contains (D) a carboxyl compound.

22. A method for obtaining a carboxyl resin having an acid value within a range from 20 to 200 mgKOH/g and being soluble in an organic solvent, comprising following steps: epoxy groups on a resin (a) having two or more epoxy groups in one molecule is made to react with 0.3-0.85 mol of a monocarboxylic acid (b) per one epoxy-group equivalent weight to obtain a reaction product (c); the epoxy group or groups on the reaction product (c) are made to react with 0.15-0.95 mol of a polybasic acid (d) per one epoxy-group equivalent weight to obtain a reaction product (e); and the epoxy group or groups on the reaction product (e) are further made to react with 1.0-5.0 mol of a monocarboxylic acid (f) per one epoxy-group equivalent weight.

* * * * *